United States Patent
Osada

(10) Patent No.: US 7,406,297 B2
(45) Date of Patent: Jul. 29, 2008

(54) CLOCK GENERATION CIRCUIT AND SEMICONDUCTOR DEVICE PROVIDED THEREWITH

(75) Inventor: Takeshi Osada, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 125 days.

(21) Appl. No.: 11/417,181

(22) Filed: May 4, 2006

(65) Prior Publication Data

US 2006/0267690 A1 Nov. 30, 2006

(30) Foreign Application Priority Data

May 30, 2005 (JP) ............... 2005-158220

(51) Int. Cl.
| H03B 5/00 | (2006.01) |
| H03L 7/06 | (2006.01) |
| H03L 7/16 | (2006.01) |
| H04B 1/40 | (2006.01) |

(52) U.S. Cl. ................ 455/75; 455/76; 331/1 A; 331/49

(58) Field of Classification Search ............ 455/75, 455/76; 331/1 A, 18, 46, 49, 57, 74
See application file for complete search history.

(56) References Cited

U.S. PATENT DOCUMENTS

| 5,133,064 A | 7/1992 | Hotta et al. |
| 5,359,727 A | 10/1994 | Kurita et al. |
| 5,506,982 A | 4/1996 | Hotta et al. |
| 5,568,512 A | 10/1996 | Rotzoll |
| 5,623,234 A * | 4/1997 | Shaik et al. .................. 331/49 |
| 5,956,378 A | 9/1999 | Soda |
| 5,994,933 A | 11/1999 | Yamanaka et al. |
| 6,130,602 A | 10/2000 | O'Toole et al. |
| 6,342,818 B1 | 1/2002 | Segawa et al. |
| 6,639,509 B1 | 10/2003 | Martinez |
| 6,894,624 B2 | 5/2005 | Kim et al. |
| 2005/0083902 A1* | 4/2005 | Hashimoto ................... 370/349 |

FOREIGN PATENT DOCUMENTS

JP 2001-251186 9/2001

* cited by examiner

*Primary Examiner*—David Mis
(74) *Attorney, Agent, or Firm*—Eric J. Robinson; Robinson Intellectual Property Law Office

(57) ABSTRACT

It is an object of the present invention to solve a problem that malfunction of communication is generated by varying a frequency of a clock due to noise from outside in a case where there is no supplied signal in a circuit which performs negative feedback control so that the supplied signal and the feedback signal can maintain a fixed phase relationship between the signals. The present invention provides a configuration including a PLL circuit and an oscillator circuit, where a switch for switching an output between a signal from the PLL circuit and a signal from the oscillator circuit to the signal output portion is provided to switch from a connection to the PLL circuit to a connection to the oscillator circuit in a case where there is no received signal.

12 Claims, 20 Drawing Sheets

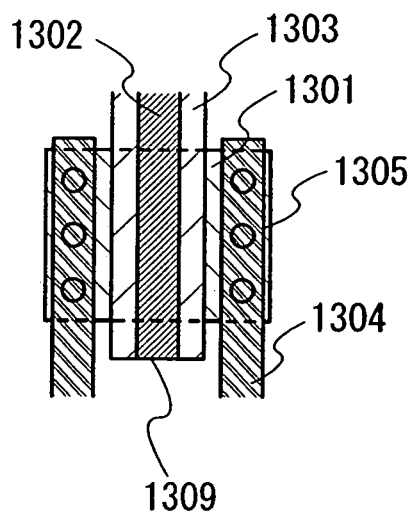
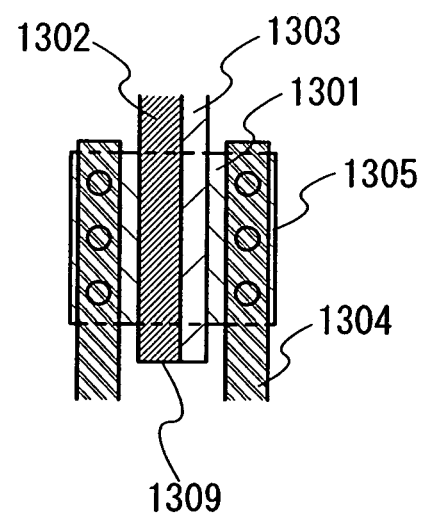
FIG. 12A  FIG. 12B
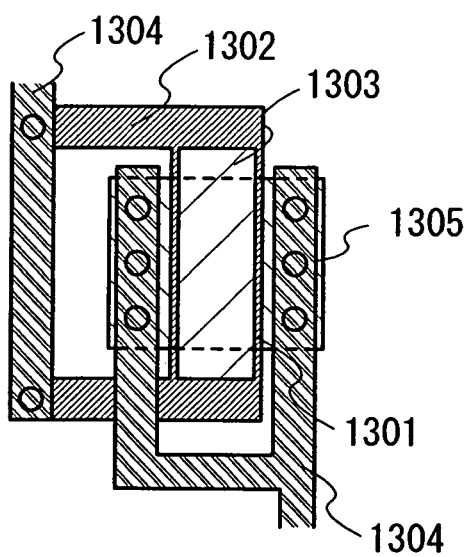
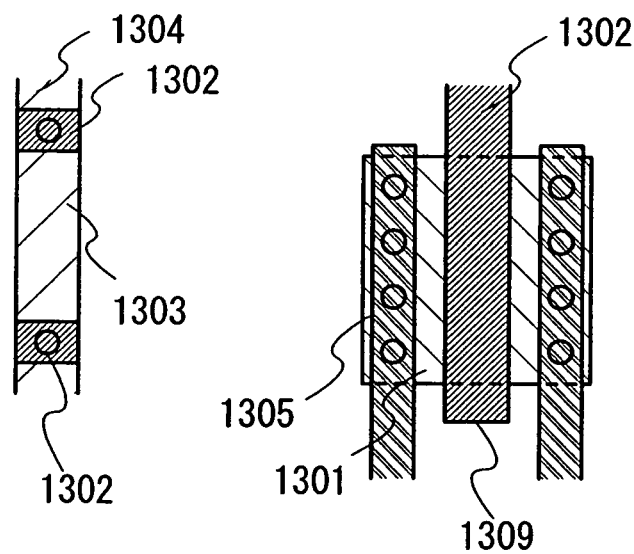
FIG. 12C  FIG. 12D  FIG. 12E

CLOCK GENERATION CIRCUIT AND SEMICONDUCTOR DEVICE PROVIDED THEREWITH

BACKGROUND OF THE INVENTION

1. Field of the Invention

The present invention relates to a clock generation circuit and a semiconductor device provided therewith.

2. Description of the Related Art

In recent years, a semiconductor in which various circuits are integrated on the same insulating surface has been developed, and a phase-locked loop circuit (hereinafter, referred to as a PLL circuit) has been known as a circuit which generates a clock with an arbitrary frequency synchronized with a supplied signal (hereinafter, a clock generation circuit).

A PLL circuit is mounted with a variable frequency oscillator, and compares a phase of a supplied signal with that of a feedback signal which is an output of the oscillator. The PLL circuit performs negative feedback control so that the supplied signal and the feedback signal can maintain a fixed phase relationship between the signals. The time required for such a control operation is called lock time.

Lock time is generally determined by the time constant of a loop filter inside a PLL circuit. If the time constant is large (if the cutoff frequency is low), locking is performed slowly, whereas if the time constant is small (if the cutoff frequency is high), locking is performed quickly. If the lock time is short, the control operation can be performed in a short time after a signal is supplied; however, since the operation is adversely affected in the case where the supplied signal has noise, it is difficult to maintain a stable control operation. Notwithstanding the aforementioned circumstance, a PLL circuit which can reduce the lock time independently of variation in operating conditions of a circuit and manufacturing conditions is known (for example, refer to Patent Document 1: Japanese Patent Laid-Open No. 2001-251186).

However, as shown in FIG. 17, a conventional PLL circuit has a phase detector 1711, a loop filter 1712 (hereinafter, referred to as LF), a voltage-controlled oscillator 1713 (hereinafter, also referred to as VCO), and a frequency divider 1714, which compares a phase of a supplied signal with that of a feedback signal (corresponding to an INPUT in FIG. 17) with a variable frequency inputted in the PLL circuit. Then, the PLL circuit performs negative feedback control so that the supplied signal and the feedback signal can maintain a fixed phase relationship between the signals.

In FIG. 17, the phase detector 1711 detects a phase difference between a signal Fs which is inputted from outside and a signal Fo/N which is inputted from the frequency divider 1714. The loop filter 1712 generates a signal Vin by removing alternating current components from a signal supplied from the phase detector 1711. The voltage-controlled oscillator 1713 outputs a signal Fo based on the signal Vin inputted from the loop filter 1712. The frequency divider 1714 converts the signal Fo inputted from the voltage-controlled oscillator 1713 into 1/N (frequency division by N), and outputs a signal Fo/N.

In this case, a stable and synchronized clock is generated because the PLL circuit compares a phase of a received signal with a signal Fs with a variable frequency from outside in a case where the signal Fs is received. However, in a case where the signal Fs with a variable frequency from outside is not received, the PLL circuit is necessary to maintain free running oscillation by a clock outputted from the PLL circuit itself.

Thus, free running oscillation becomes unstable when noise such as variation or the like in a power source is contaminated, and accordingly, a fixed and stable clock cannot be generated. Therefore, in a case where a stable power source from outside is not supplied, a frequency of a clock is varied during transmission after reception, which leads to malfunction of communication.

FIG. 18 shows an example in which a conventional PLL circuit generates a clock in synchronization with a received signal. In this example, the phase detector 1711 in FIG. 17 is a circuit which operates exclusive OR, for example, an exclusive OR circuit (hereinafter, a XOR circuit) shown in FIG. 18A. In FIG. 18B, data denotes a received signal, dclock (divide clock) denotes an output of the frequency divider 1714, which is a signal inputted to the phase detector by being fed back, and clock denotes an output of a VCO 1713. As shown in FIG. 18B, in a case where there is no input in a received signal data or a fixed state (H level or L level) maintain for a long time, the PLL circuit does not perform negative feedback control and performs free running oscillation. Accordingly, the problem occurs that clock is stopped when an output of the PLL circuit becomes unstable due to noise or the like of a power source.

SUMMARY OF THE INVENTION

In view of the foregoing problems, it is an object of the present invention to provide a clock generation circuit and a semiconductor device which solve the foregoing problem.

One feature of the present invention is a clock generation circuit having a configuration including a PLL circuit and an oscillator circuit, where a switch for switching between a connection of an output portion of the PLL circuit to a signal output portion and a connection of the oscillator circuit to the signal output portion is provided.

Another feature of the present invention is a clock generation circuit having a configuration including a PLL circuit and an oscillator circuit, where a switch for switching between an input signal to be inputted to a signal input portion of the PLL circuit and a signal of the oscillator circuit to be inputted to the signal input portion of the PLL circuit is provided.

Another feature of the present invention is a clock generation circuit having a configuration including a PLL circuit, an oscillator circuit, and a determination circuit, where, in a signal input portion, the determination circuit is a circuit which determines a first period from receiving a reception start signal to receiving a reception end signal and a second period except for the period from receiving a reception start signal to receiving a reception end signal; and a switch for selecting a connection of the PLL circuit to a signal output portion in the first period and selecting a connection of the oscillator circuit to the signal output portion in the second period is provided.

Another feature of the present invention is a clock generation circuit having a configuration including a PLL circuit, an oscillator circuit, and a determination circuit, where, in a signal input portion, the determination circuit is a circuit which determines a first period from receiving a reception start signal to receiving a reception end signal and a second period except for the period from receiving a reception start signal to receiving a reception end signal by the clock generation circuit; and a switch for selecting an input signal in the first period to be inputted to a signal input portion of the PLL circuit and selecting a signal of the oscillator circuit in the second period to be inputted to the signal input portion of the PLL circuit is provided.

In the present invention, the PLL circuit may have a configuration having a phase detector, a loop filter, a voltage-controlled oscillator, and a frequency divider.

In the present invention, the PLL circuit may have a configuration having a prescaler or a swallow counter.

In the present invention, the oscillator circuit may be a ring oscillator.

One feature of the present invention is a semiconductor device which is provided with an antenna and transmits and receives a signal by wireless communication, having a configuration including a rectification circuit which generates driving power from a signal received by the antenna, a demodulation circuit which demodulates the signal received by the antenna, and a clock generation circuit which generates a clock signal synchronized with the demodulated signal, where the clock generation circuit has a PLL circuit and an oscillator circuit; and a switch for switching between a connection of an output portion of the PLL circuit to a signal output portion of the clock generation circuit and a connection of the oscillator circuit to the signal output portion of the clock generation circuit is provided.

Another feature of the present invention is a semiconductor device which is provided with an antenna and transmits and receives a signal by wireless communication, having a configuration including a rectification circuit which generates driving power from a signal received by the antenna, a demodulation circuit which demodulates the signal received by the antenna, and a clock generation circuit which generates a clock signal synchronized with the demodulated signal, where the clock generation circuit has a PLL circuit and an oscillator circuit; and a switch for switching between an input signal of the clock generation circuit to be inputted to a signal output portion of the PLL circuit and a signal of the oscillator circuit to be inputted to the signal output portion of the PLL circuit is provided.

Another feature of the present invention is a semiconductor device which is provided with an antenna and transmits and receives a signal by wireless communication, having a configuration including a rectification circuit which generates driving power from a signal received by the antenna, a demodulation circuit which demodulates the signal received by the antenna, and a clock generation circuit which generates a clock signal synchronized with the demodulated signal, where the clock generation circuit has a PLL circuit, an oscillator circuit, and a determination circuit; in a signal input portion, the determination circuit is a circuit which determines a first period from receiving a reception start signal to receiving a reception end signal and a second period except for the period from receiving a reception start signal to receiving a reception end signal; and a switch for selecting a connection of the PLL circuit to a signal output portion in the first period and selecting a connection of the oscillator circuit to the signal output portion in the second period is provided.

Another feature of the present invention is a semiconductor device which is provided with an antenna and transmits and receives a signal by wireless communication, having a configuration including a rectification circuit which generates driving power from a signal received by the antenna, a demodulation circuit which demodulates the signal received by the antenna, and a clock generation circuit which generates a clock signal synchronized with the demodulated signal, where the clock generation circuit has a PLL circuit, an oscillator circuit, and a determination circuit; in a signal input portion, the determination circuit is a circuit which determines a first period from receiving a reception start signal to receiving a reception end signal and a second period except for the period from receiving a reception start signal to receiving a reception end signal; and a switch for selecting an input signal of the clock generation circuit in the first period to be inputted to a signal input portion of the PLL circuit and selecting a signal of the oscillator circuit in the second period to be inputted to the signal input portion of the PLL circuit is provided.

In the present invention, the PLL circuit may have a configuration having a phase detector, a loop filter, a voltage-controlled oscillator, and a frequency divider.

In the present invention, the PLL circuit may have a configuration having a prescaler or a swallow counter.

In the present invention, the oscillator circuit may be a ring oscillator.

According to the present invention, a circuit can be realized, which is strong in noise contamination due to variation or the like in a power source and which generates a clock stably even in a state of existing no received signal.

In addition, the present invention provides a clock generation circuit provided with a configuration in which a circuit for generating a clock used in demodulating an inputted signal and a circuit for generating a clock used in modulating an outputted signal are separately provided. Therefore, even when an input signal is not received, the clock in modulating the outputted signal can be generated stably.

It is to be noted that in modulating the outputted signal, the present invention may have a configuration in which the phase detector in the PLL circuit is not needed though the phase detector in the PLL circuit intervenes because a clock signal is generated by the oscillator circuit. Therefore, the generation of a clock in the PLL circuit can be stopped, and thus, power consumption can be reduced.

BRIEF DESCRIPTION OF THE DRAWING

In the accompanying drawings:

FIGS. 12A to 12E are views explaining Embodiment 1 of the present invention;

DETAILED DESCRIPTION OF THE INVENTION

Figure 1:
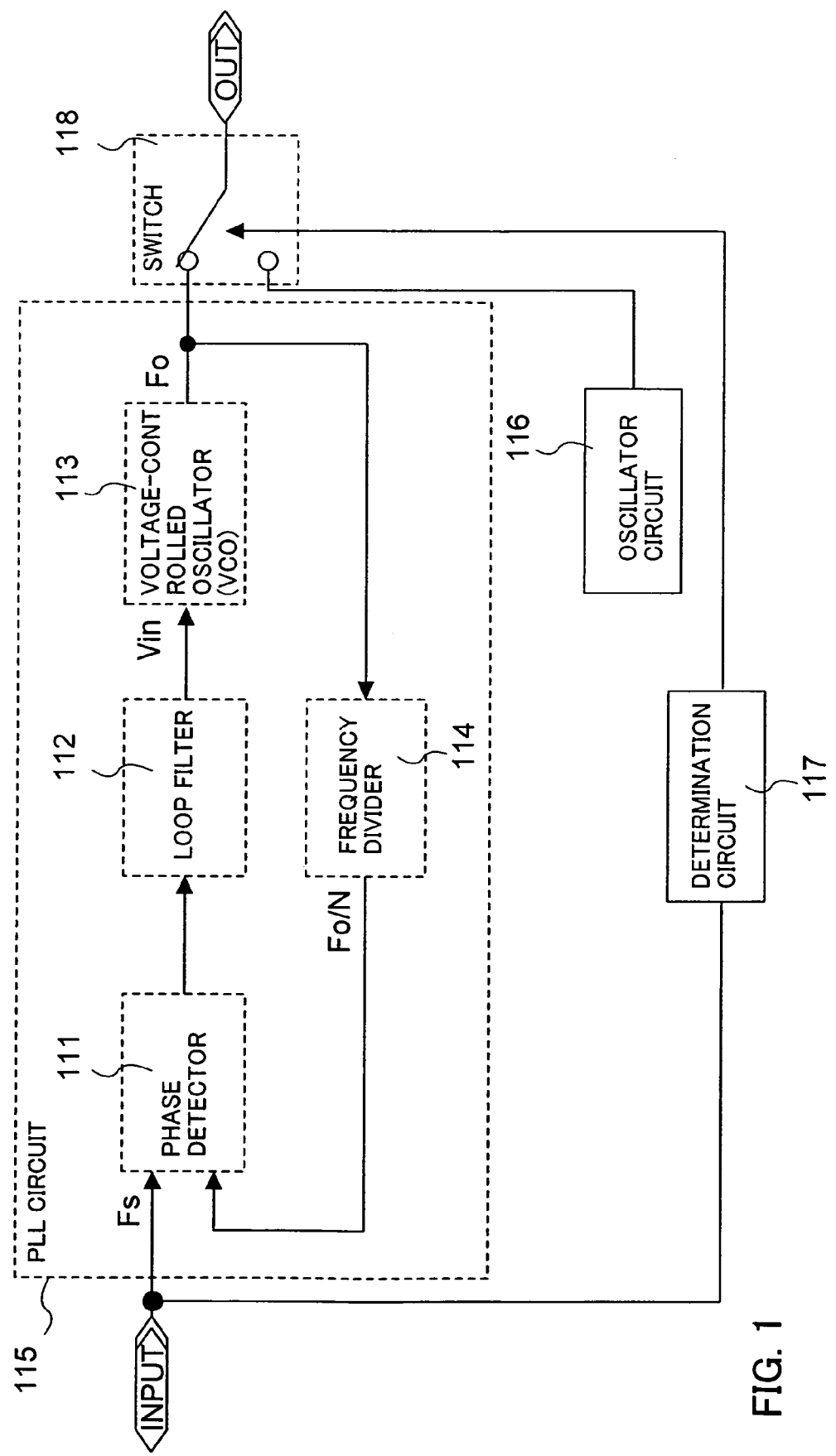
FIG. 1 is a diagram explaining Embodiment Mode 1 of the present invention.

Embodiment Modes of the present invention will be explained below with reference to the accompanied drawings. However, it is to be easily understood that various changes and modifications will be apparent to those skilled in the art. Therefore, unless such changes and modifications depart from the scope of the invention, they should be construed as being included therein. Note that identical portions or portions having the same function in all figures for explaining embodiment modes are denoted by the same reference numerals and detailed descriptions thereof are omitted.

Embodiment Mode 1

FIG. 1 shows a clock generation circuit according to this embodiment mode. This clock generation circuit has a PLL circuit 115 and an oscillator circuit 116 as two types of clock generation circuits. The PLL circuit 115 has a phase detector 111, a loop filter 112, a voltage-controlled oscillator 113 (hereinafter, also referred to as VCO), and a frequency divider 114. The phase detector 111 detects a phase difference between a signal Fs, which is inputted from outside, and a signal Fo/N, which is inputted from the frequency divider 114. The loop filter 112 generates a signal Vin by removing alternating current components from a signal supplied from the phase detector 111. The voltage-controlled oscillator 113 outputs a signal Fo based on the signal Vin inputted from the loop filter 112. The frequency divider 114 converts the signal Fo inputted from the voltage-controlled oscillator 113 into 1/N (frequency division by N), and outputs a signal Fo/N. A switch 118 can switch connections between the PLL circuit 115 or the oscillator circuit 116 and an output OUT of the clock generation circuit. The switch 118 is controlled by a determination circuit 117 which determines the switching by an input signal INPUT.

It is to be noted that the PLL circuit according to this embodiment mode has the voltage-controlled oscillator 113. The phase detector 111, the loop filter 112, and the frequency divider 114 are appropriately provided according to usage.

Since the phase detector 111 is theoretically regarded as a multiplier, it can be replaced by an analog phase detector (e.g., a DBM (Double Balanced Mixer)) or a digital phase detector (e.g., an XOR, an RD flip-flop, or a something with a current output type).

Similarly, as the loop filter, it is acceptable as long as anything can remove high frequency components, and it can be replaced by a passive loop filter (e.g., a low-pass filter or a lag-lead filter) or an active loop filter.

The frequency divider divides an output frequency by N; therefore, when it is provided, Fo with a frequency which is N times as high as that of the input signal can be obtained. Alternatively, if a prescaler (fixed frequency divider) with a high operating frequency is provided, Fo with a high frequency can be obtained. If a programmable frequency divider is provided as the frequency divider, Fo with an arbitrary frequency can be obtained.

In this embodiment mode, a configuration in which Fs with an input frequency is inputted using a quartz-crystal oscillator may be employed. By the configuration provided with the quartz-crystal oscillator, a signal having a fine waveform can be inputted as an input signal, and accordingly, a fine output waveform can be obtained. Alternatively, Fs with an input frequency may be inputted using an LC resonant circuit. By providing the LC resonant circuit, the clock generation circuit can be downsized and, for example, can be mounted on a tag for an RFID or the like.

The PLL circuit according to this embodiment mode may have the other component and, for example, may have a swallow counter or the like. For example, if a configuration provided with the swallow counter is employed, Fo with an arbitrary frequency can be obtained.

A configuration of a unit circuit 201 of the phase detector 111 will be explained with reference to FIG. 2. The unit circuit 201 includes a NOR circuit 202 and transistors 203 to 208. In addition, the unit circuit 201 has two input terminals (indicated by in1 and in2 in the drawing) and one output terminal (indicated by out in the drawing). This unit circuit 201 operates in the following manner. Upon inputting the same signals to the input terminal in1 and the input terminal in2, respectively, an H-level signal is outputted from the output terminal out. Upon inputting different signals to the input terminal in1 and the input terminal in2, respectively, an L-level signal is outputted from the output terminal out. That is, the unit circuit 201 compares a phase of a signal inputted to the input terminal in1 with that of a signal inputted to the input terminal in2, and outputs a signal from the output terminal out based on the result of the comparison. It is to be noted that the configuration of the unit circuit 201 is not limited to this configuration, and the other well-known configuration may be employed.

Next, a configuration of a unit circuit 301 included in the frequency divider 114 will be explained with reference to FIG. 3. The unit circuit 301 includes an inverter circuit 302, NAND circuits 303 to 309, and inverter circuits 310 and 311. This unit circuit 301 has four input terminals (indicated by in1, in2, in3, and in4 in the drawing) and two output terminals (indicated by out1 and out2 in the drawing). In addition, the unit circuit 301 includes three latches, formed respectively by the NAND circuits 304 and 305, the NAND circuits 306 and 307, and the NAND circuits 308 and 309. When a set signal is inputted from the input terminal in1, a data signal is inputted from the input terminal in2, a clock signal is inputted from the input terminal in3, and a reset signal is inputted from the input terminal in4, a data signal is outputted from the output terminal out1 and a data signal is outputted from the output terminal out2. Although the aforementioned configuration shows a set/reset D flip-flop circuit, the present invention is not limited to this configuration. For example, a JK flip-flop circuit or a T flip-flop circuit may be employed.

Figure 4:
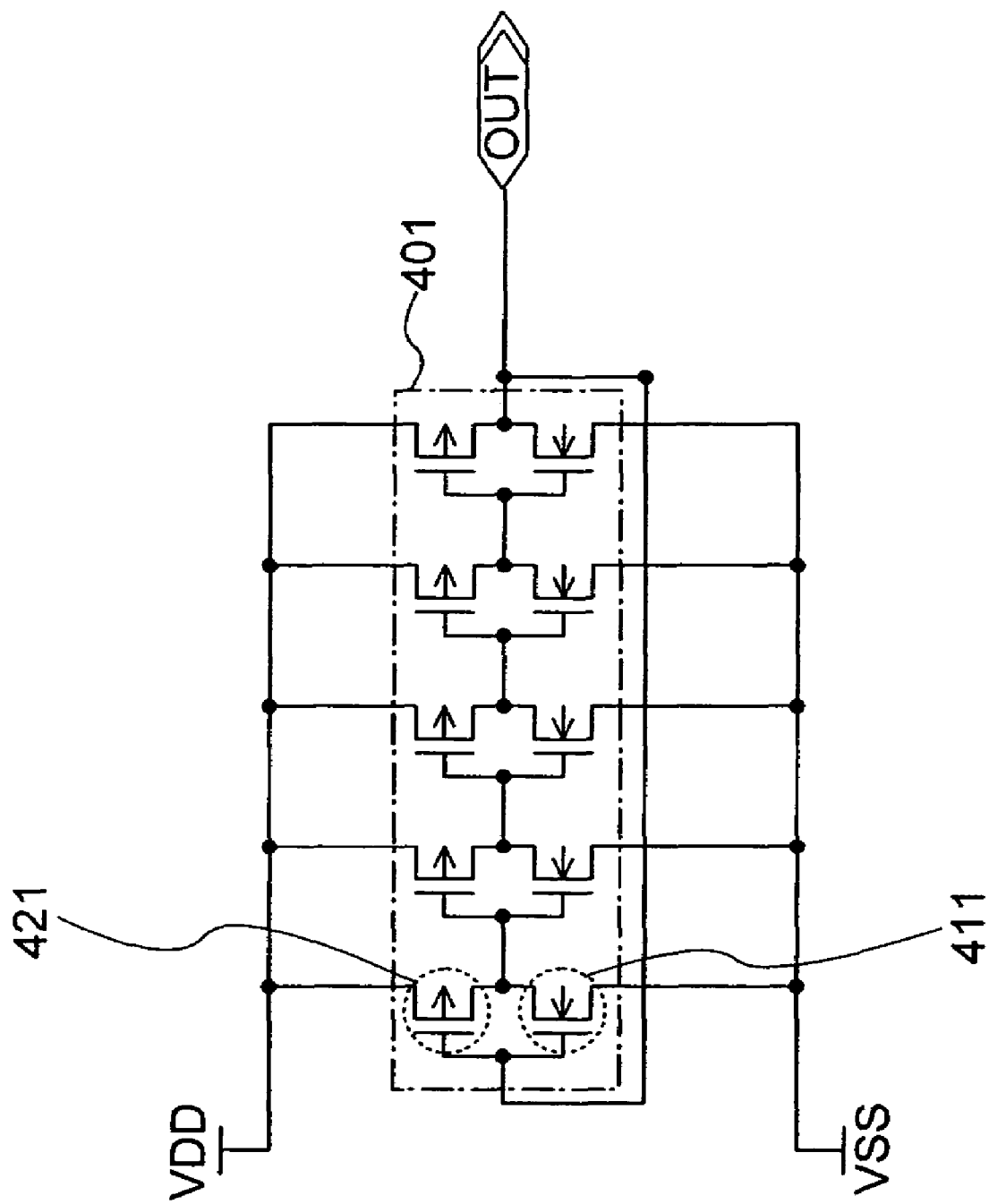
FIG. 4 is a diagram explaining Embodiment Mode 1 of the present invention.

Next, FIG. 4 shows an example of the oscillator circuit 116 used for the clock generation circuit. In an oscillator circuit 401, an n-channel transistor 411 and a p-channel transistor 421 are connected in series, includes an inverter configuration to which gates of the two transistors are connected, and has a configuration including a plurality of inverters by setting the inverter as one unit. In FIG. 4, the oscillator circuit 401 has a configuration of five stages (five units); however, the present invention is not limited thereto. As for a plurality of inverters, an input and an output are connected to each other and a last-stage output is connected to a first-stage input terminal of an inverter to form a loop configuration. As for the number of the inverters in this loop, it is necessary to have an odd number of inverters in order to oscillate a signal from the oscillator circuit.

Figure 5:
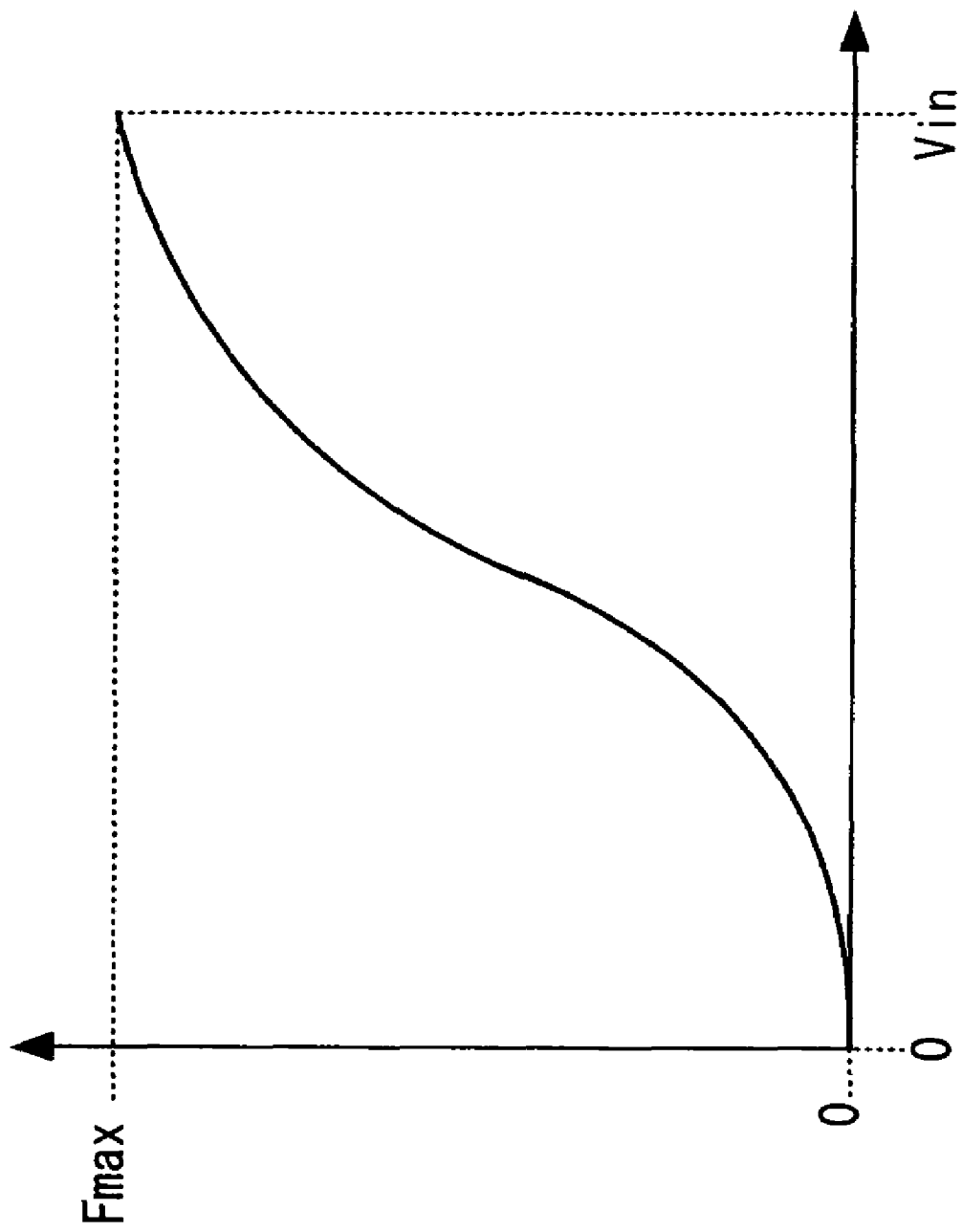
FIG. 5 is a view explaining Embodiment Mode 1 of the present invention.

In addition, FIG. 5 shows characteristics of an output frequency F with respect to an input voltage Vin of the voltage-controlled oscillator 113. The VCO outputs an F with a frequency corresponding to an input voltage Vin. The VCO outputs a signal with a high frequency if the input voltage is high, and outputs a signal with a low frequency if the input voltage is low.

Figure 6A:
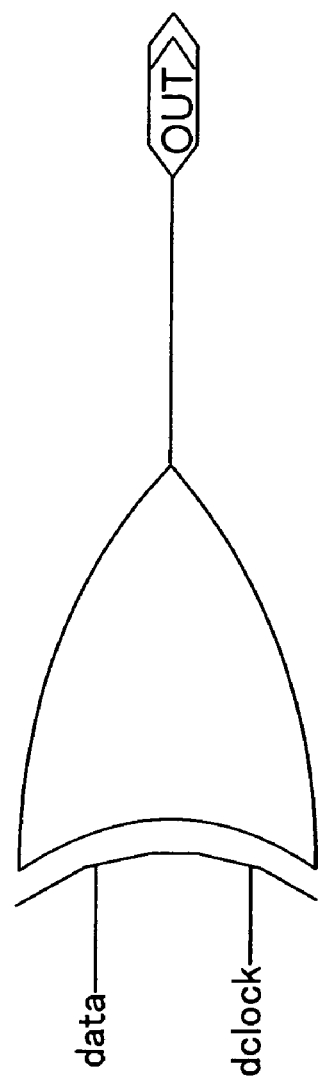
FIGS. 6A and 6B are diagrams explaining Embodiment Mode 1 of the present invention.
Figure 6B:
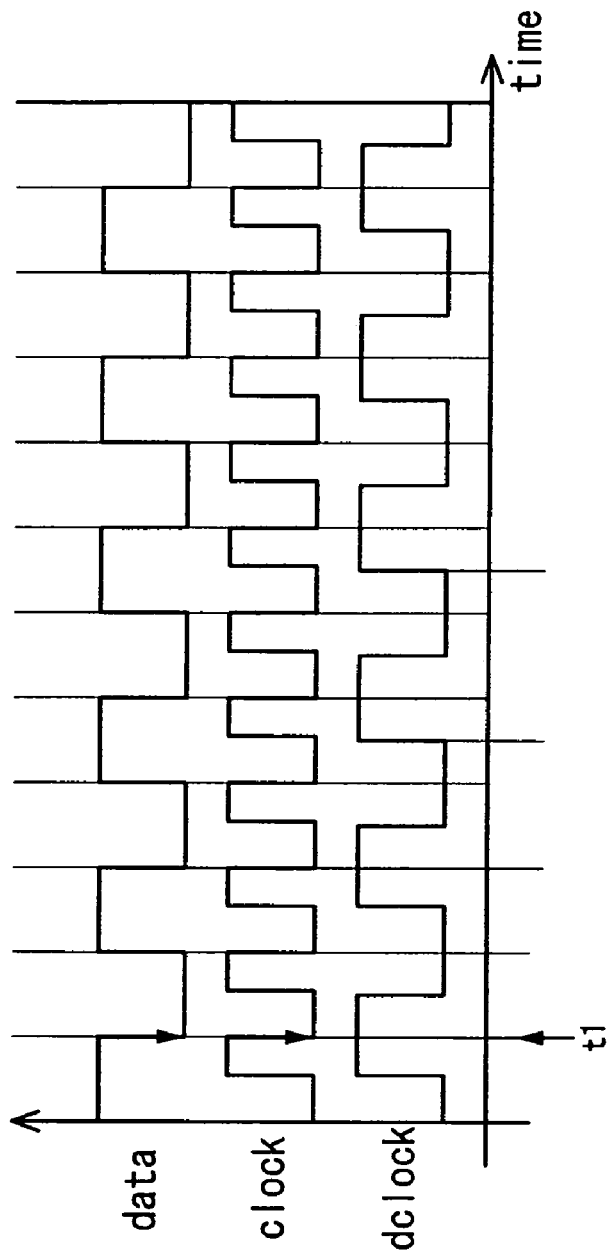

FIG. 6 shows an example in which the PLL circuit generates a clock normally in synchronization with a received signal. This example shows a case where the phase detector 111 in FIG. 1 is an XOR (refer to FIG. 6A). In FIG. 6B, data denotes a received signal, dclock denotes an output of the frequency divider 114, which is a signal inputted to the phase detector 111 by being fed back, and clock denotes an output of the voltage-controlled oscillator 113. In this example, the frequency divider 114 divides a frequency by 2 (N=2).

In FIG. 6, at the timing of t1, falling of the data and falling of the clock are synchronized (in the present invention, an operation of changing a signal from an H level to an L level is referred to as falling), and a normal clock is outputted.

Figure 7:
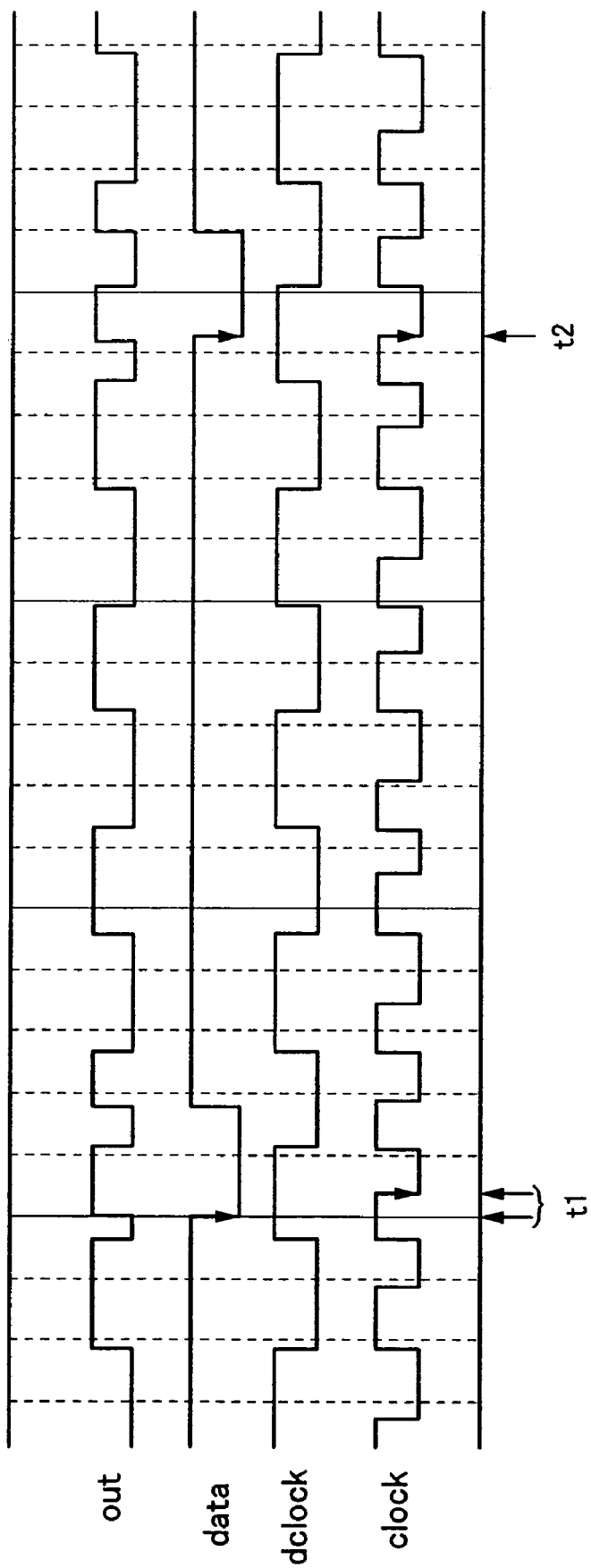
FIG. 7 is a diagram explaining Embodiment Mode 1 of the present invention.

FIG. 7 shows a state of locking of the PLL circuit in a case where a logic value "0" which is defined by Class1-Tag of 860 to 930 MHz defined by EPCglobal, standard setting organization of an RFID, is inputted as data. At the time of t1, falling of the received signal data and rising of clock of an output of the PLL circuit are not conducted at the same time unlike FIG. 6B, and are not synchronized. Therefore, the XOR outputs Vin, which is a high voltage, so that an output frequency of the voltage-controlled oscillator 113 gets faster. As a result, data and clock are synchronized at the time of t2.

Figure 18A:
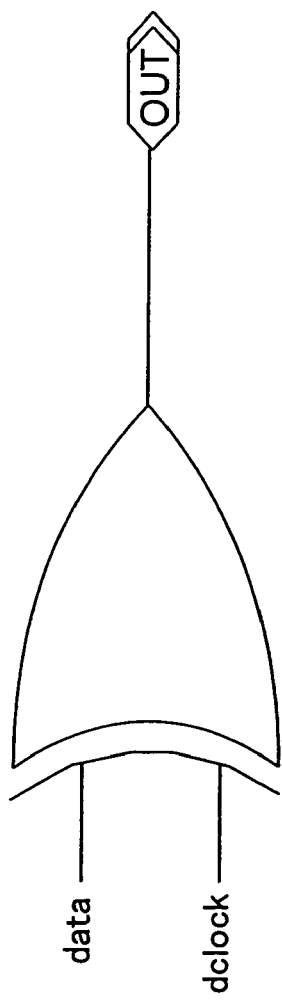
FIGS. 18A and 18B are diagrams explaining a conventional mode.
Figure 18B:
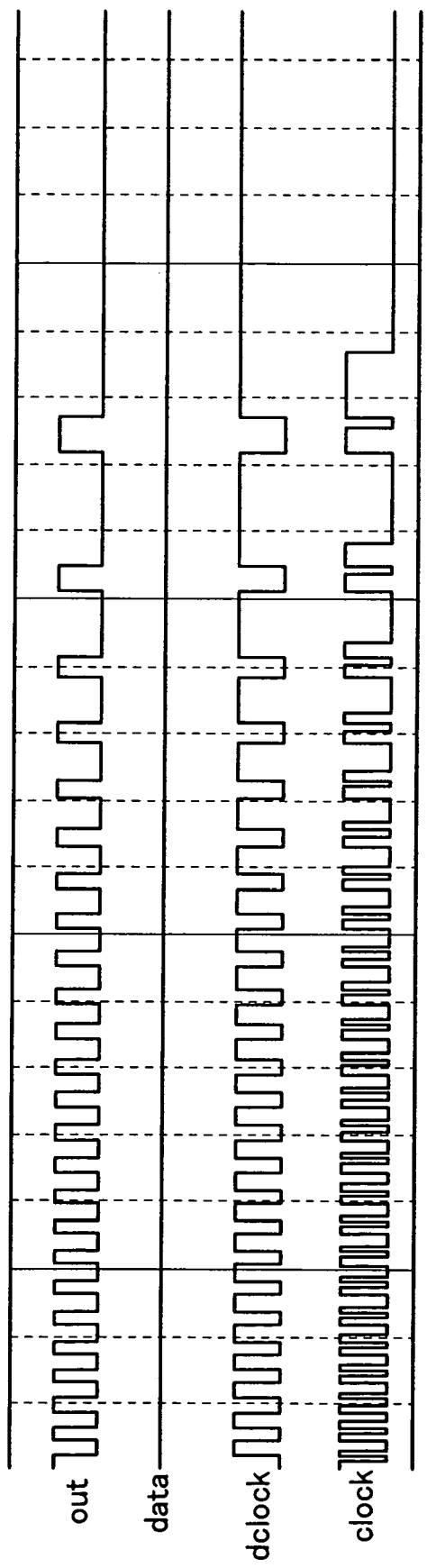

In FIG. 7, an input of data (Low or High) is conducted; therefore, negative feedback can be conducted by calculating with the use of the phase detector 111. However, in a case where an input to the received signal data is not conducted like FIG. 18B described above or a case where a constant state (High or Low) maintains for a long time, negative feedback of the PLL circuit is not conducted, which leads to a state of free-running oscillation. Therefore, there is a case where clock is stopped when a state becomes unstable by noise or the like of a power source, or a case where a normal operation cannot be conducted because a clock conducts an output with a width.

Figure 8:
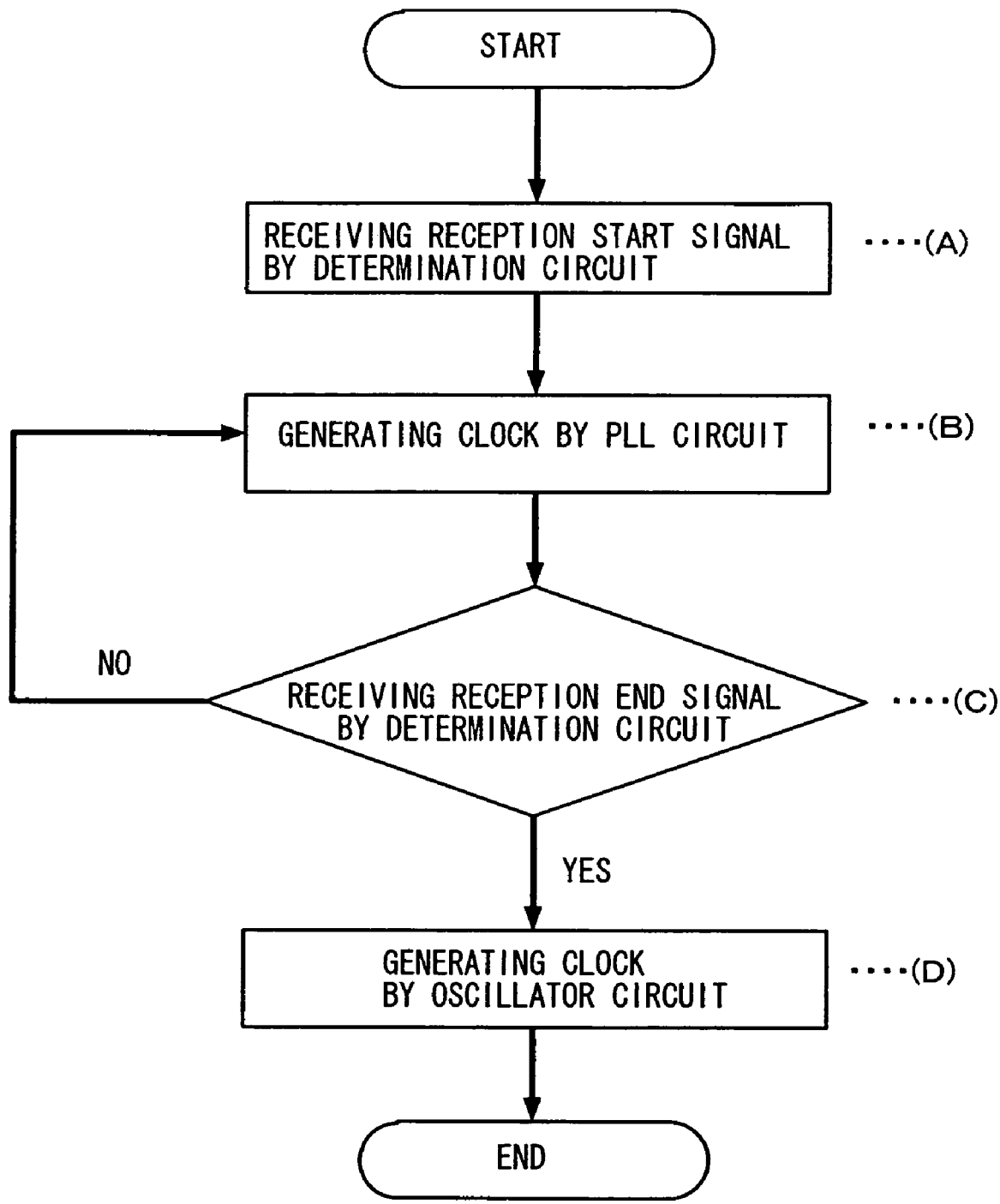
FIG. 8 is a flowchart explaining Embodiment Mode 1 of the present invention.

Next, FIG. 8 shows a flowchart of an operation of the clock generation circuit according to this embodiment mode, and an operation of the clock generation circuit of the present invention will be explained.

First, a reception start signal is inputted in an input terminal of the clock generation circuit (A). Next, a switch 118 is set on the PLL circuit 115 side by a determination circuit 117 in the clock generation circuit, and the PLL circuit 115 is operated and the PLL circuit generates a clock (B). Then, in the clock generation circuit, when a reception end signal is received (C), the switch 118 is set on the oscillator circuit 116 side by the determination circuit 117. And then, in the clock generation circuit, the oscillator circuit outputs a clock (D). Thus, even if an operation of not receiving a received signal like (B) in FIG. 8 is conducted in the PLL circuit 115, the clock generation circuit of the present invention can conduct an operation by switching to the oscillator circuit (FIG. 8).

It is to be noted that, in this specification, a period from receiving a reception start signal to receiving a reception end signal by the clock generation circuit is referred to as a first period. Further, a period except for the period from receiving a reception start signal to receiving a reception end signal by the clock generation circuit is referred to as a second period.

In FIG. 8 which is described above, the switch 118 is switched to a connection with the PLL circuit in order for a clock, which is generated from the PLL circuit in the first period, to be an output from the clock generation circuit. Further, the switch 118 is switched to a connection with the oscillator circuit in order for a clock, which is generated from the oscillator circuit in the second period, to be an output from the clock generation circuit.

The clock generation circuit in this embodiment mode can be operated by switching between an output of a clock from the PLL circuit and an output of a clock from the oscillator circuit between the first period and the second period; therefore, a circuit can be realized, which is strong in noise contamination due to variation or the like in a power source and which generates a clock stably even in a state of existing no received signal.

It is to be noted that the clock generation circuit in this embodiment mode is a clock generation circuit provided with a configuration in which a circuit for generating a clock used in demodulating a signal inputted in the first period and a circuit for generating a clock used in modulating a signal to be outputted in the second period are separately provided. Therefore, even when an input signal is not received, the clock in modulating the signal to be outputted can be generated stably.

It is to be noted that the clock generation circuit in this embodiment mode may have a configuration in which the phase detector in the PLL circuit is not needed though the phase detector in the PLL circuit intervenes, because a clock signal is generated by the oscillator circuit in modulating the signal to be outputted in the second period. At this time, one of the PLL circuit and the oscillator circuit which is not involved with a connection may be connected to a GND potential. Therefore, the generation of a clock in the PLL circuit can be stopped, and thus, power consumption can be reduced.

It is to be noted that this embodiment can be freely combined with another embodiment mode or embodiment.

Embodiment Mode 2

Figure 9:
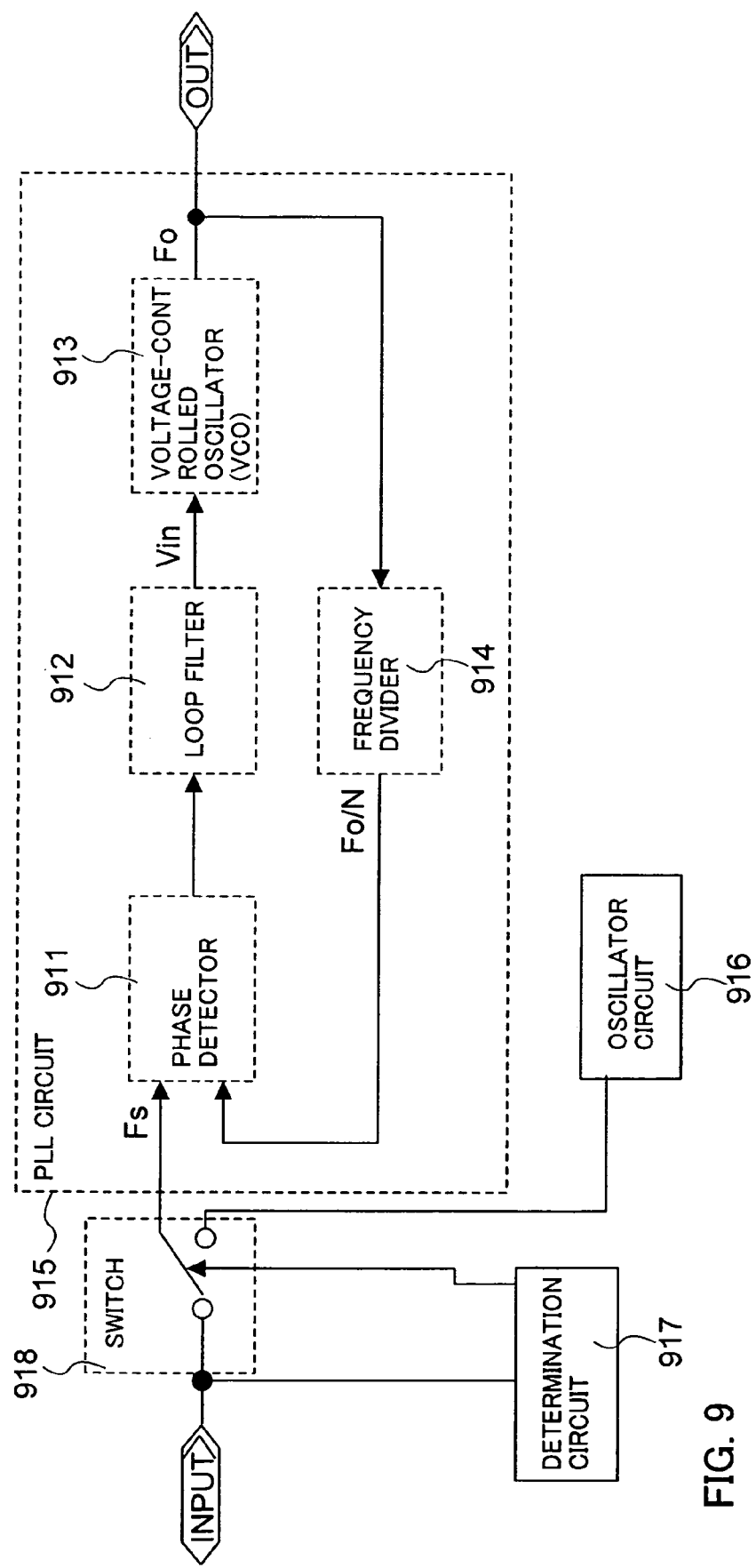
FIG. 9 is a diagram explaining Embodiment Mode 2 of the present invention.

FIG. 9 shows a clock generation circuit according to this embodiment mode. This clock generation circuit has a PLL circuit 915 and an oscillator circuit 916 as two types of clock generation circuits. The PLL circuit 915 as a phase detector 911, a loop filter (LF) 912, a voltage-controlled oscillator (hereinafter, also referred to as VCO) 913, and a frequency divider 914. The phase detector 911 detects a phase difference between a signal Fs, which is inputted from outside, and a signal Fo/N, which is inputted from the frequency divider 914. The loop filter 912 generates a signal Vin by removing alternating current components from a signal supplied from the phase detector 911. The voltage-controlled oscillator 913 outputs a signal Fo based on the signal Vin inputted from the loop filter 912. The frequency divider 914 converts the signal Fo inputted from the voltage-controlled oscillator 913 into 1/N (frequency division by N), and outputs a signal Fo/N. The PLL circuit 915 and the oscillator circuit 916 can switch an input signal INPUT by a switch 918, and the control is conducted by a determination circuit 917 which determines the switching by the input signal INPUT.

A difference from FIG. 1 shown in Embodiment Mode 1 is that the switch 918 is provided on the input side.

It is to be noted that the PLL circuit according to this embodiment mode has the voltage-controlled oscillator 913. The phase detector 911, the loop filter 912, and the frequency divider 914 are appropriately provided according to usage.

Since the phase detector 911 is theoretically regarded as a multiplier, it can be replaced by an analog phase detector (e.g., a DBM (Double Balanced Mixer)) or a digital phase detector (e.g., an XOR, an RD flip-flop, or a something with a current output type).

Similarly, as the loop filter, it is acceptable as long as anything can remove high frequency components, and it can be replaced by a passive loop filter (e.g., a low-pass filter or a lag-lead filter) or an active loop filter.

The frequency divider divides an output frequency by N; therefore, when it is provided, Fo with a frequency which is N times as high as that of the input signal can be obtained. Alternatively, if a prescaler (fixed frequency divider) with a high operating frequency is provided, Fo with a high frequency can be obtained. If a programmable frequency divider is provided as the frequency divider, Fo with an arbitrary frequency can be obtained.

In this embodiment mode, a configuration in which Fo with an input frequency is inputted using a quartz-crystal oscillator may be employed. By the configuration provided with the quartz-crystal oscillator, a signal having a fine waveform can be inputted as an input signal, and accordingly, a fine output waveform can be obtained. Alternatively, Fo with an input frequency may be inputted using an LC resonant circuit. By providing the LC resonant circuit, the clock generation circuit can be downsized and, for example, can be mounted in a tag for an RFID or the like.

The PLL circuit according to this embodiment mode may have the other component and, for example, may have a swallow counter or the like. For example, if a configuration provided with the swallow counter is employed, Fo with an arbitrary frequency can be obtained.

Figure 2:
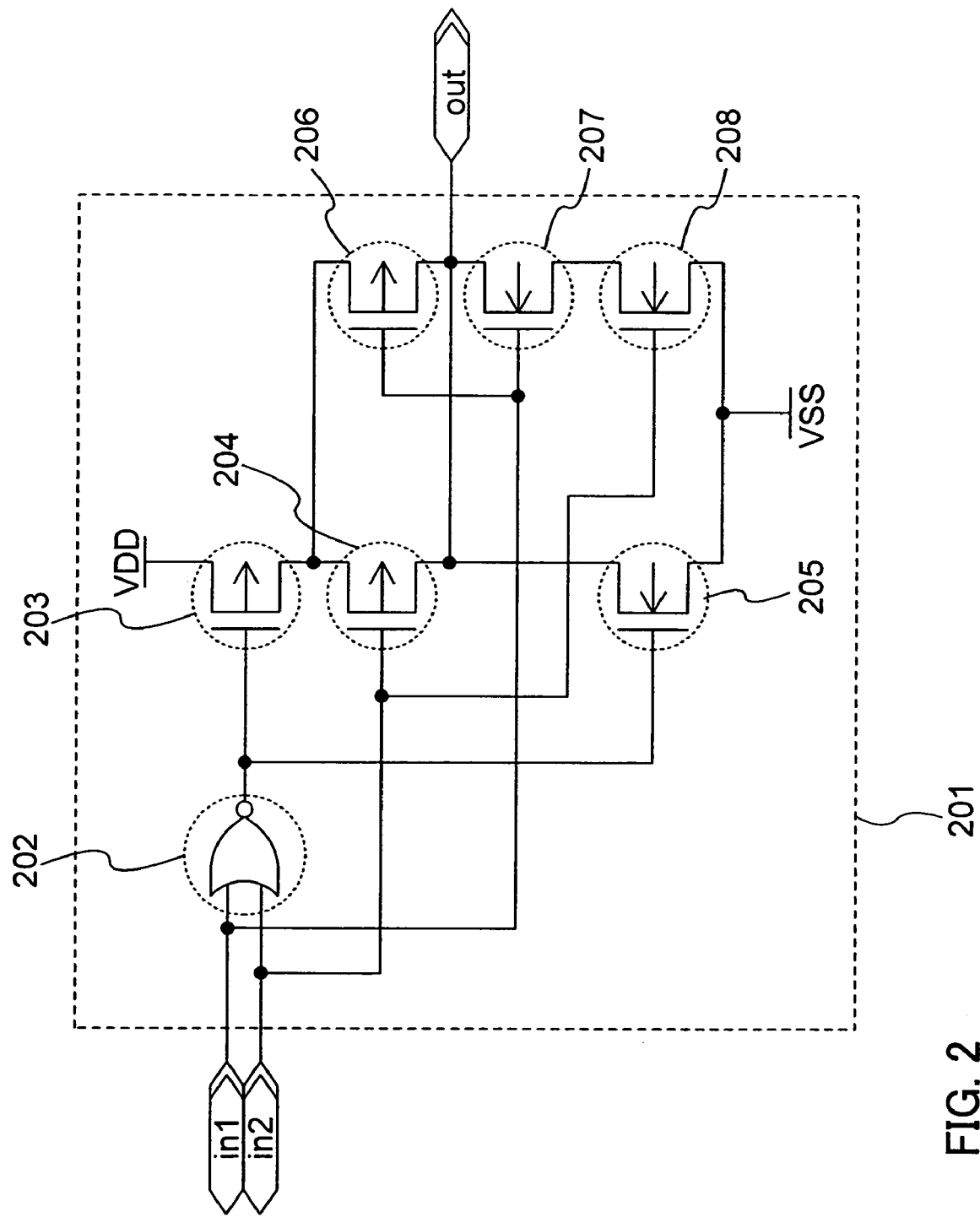
FIG. 2 is a diagram explaining Embodiment Mode 1 of the present invention.

It is to be noted that the configuration of the phase detector 911 is similar to FIG. 2 shown in Embodiment Mode 1, so it is not described here in detail.

Figure 3:
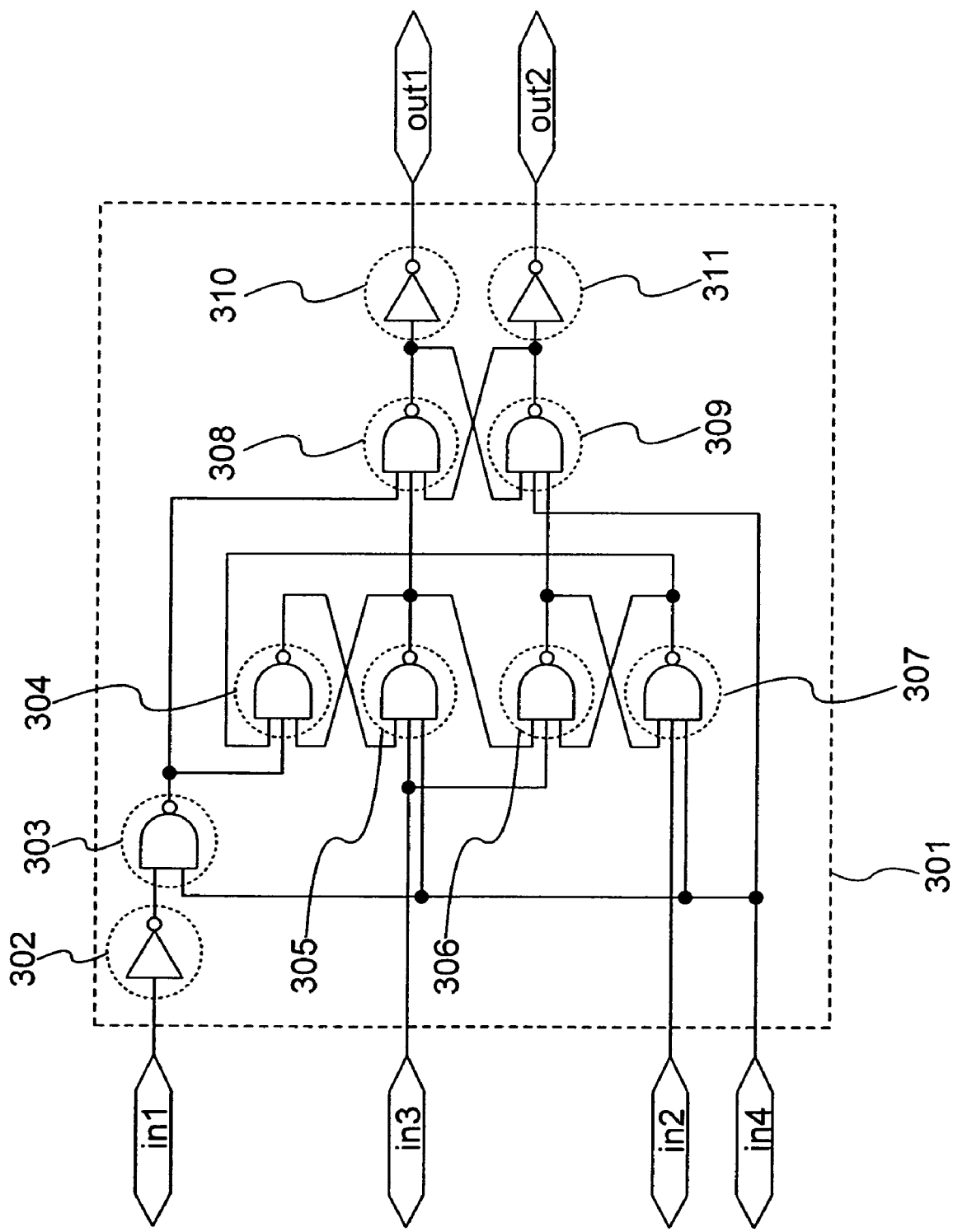
FIG. 3 is a diagram explaining Embodiment Mode 1 of the present invention.

It is to be noted that the configuration of the frequency divider 914 is similar to FIG. 3 shown in Embodiment Mode 1, so it is not described here in detail.

It is to be noted that the oscillator circuit 916 used in the clock generation circuit is similar to FIG. 4 shown in Embodiment Mode 1, so it is not described here in detail.

It is to be noted that characteristics of F with an output frequency with respect to an input voltage Vin of the voltage-controlled oscillator 913 is similar to FIG. 5 shown in Embodiment Mode 1, so it is not described here in detail.

It is to be noted that, in this specification, a period from receiving a reception start signal to receiving a reception end signal by the clock generation circuit is referred to as a first period in the same manner as Embodiment Mode 1. Further, a period except for the period from receiving a reception start signal to receiving a reception end signal by the clock generation circuit is referred to as a second period.

In FIG. 8 described above, the switch 918 generates a clock from the PLL circuit in the first period, and the switch is switched to a connection with the oscillator circuit in order to make the clock be an output from the clock generation circuit. The switch 918 generates a clock from the oscillator circuit in the second period, and the switch is switched to a connection with the oscillator circuit in order to make the clock be an output from the clock generation circuit.

The clock generation circuit in this embodiment mode can conduct an operation by switching between an output of a clock from the PLL circuit and an output of a clock from the oscillator circuit between the first period and the second period; therefore, a circuit, which is strong in a mixture of noise due to variation in a power source or the like and which generates a clock stably even in a state of existing no received signal, can be realized.

It is to be noted that the clock generation circuit in this embodiment mode is a clock generation circuit provided with a configuration in which a circuit for generating a clock used in demodulating an inputted signal in the first period and a circuit for generating a clock used in modulating an outputted signal in the second period are separately provided. Therefore, even when an input signal is not received, the clock in modulating an outputted signal can be generated stably.

It is to be noted that this embodiment can be freely combined with another embodiment mode or embodiment.

Embodiment 1

Figure 10:
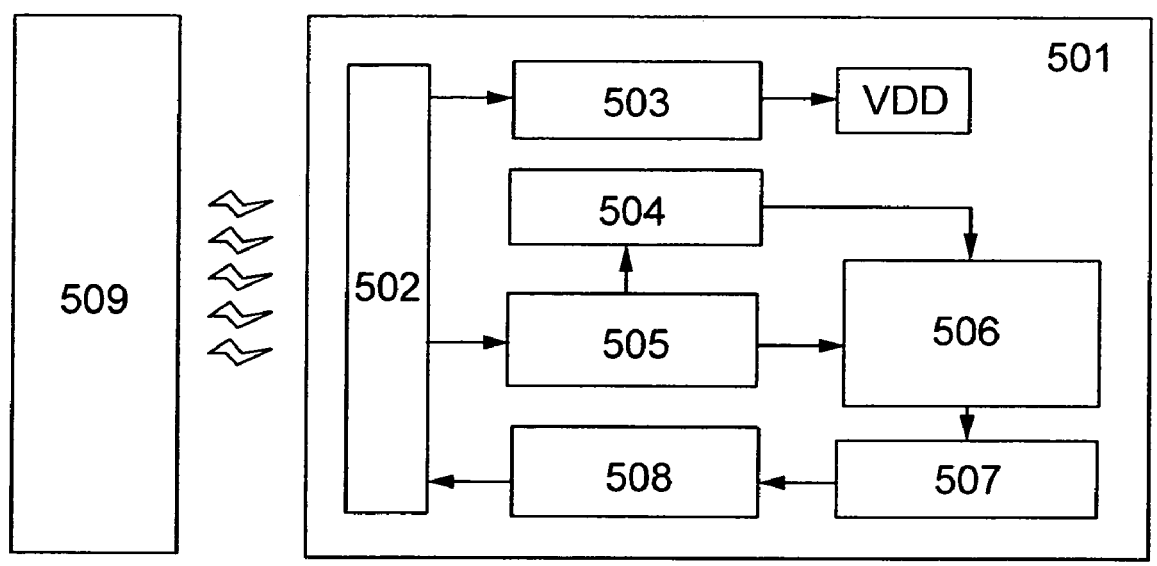
FIG. 10 is a diagram explaining Embodiment 1 of the present invention.

FIG. 10 is a configuration of a semiconductor device which transmits and receives a signal with wireless communication. A semiconductor device 501 has a function to conduct wireless communication with a reader/writer device 509. The reader/writer device 509 is connected by a communication line, and a function to conduct data communication with the semiconductor device 501 by a control with a computer or as a terminal of a computer. In addition, the reader/writer device 509 may have a structure which conducts communication with the semiconductor device 501 independently from a network.

The semiconductor device 501 has a resonant circuit 502, a power supply circuit 503, a clock generation circuit 504, a demodulation circuit 505, a control circuit 506, a memory portion 507, and an encoding and modulation circuit 508. The resonant circuit 502 and the power supply circuit 503 are formed by an analog circuit, and the control circuit 506 and the memory portion 507 are formed by a digital circuit. The clock generation circuit 504, the demodulation circuit 505, and the encoding and modulation circuit 508 has an analog portion and a digital portion. Note that instead of the resonant circuit 502, an antenna may be used.

Figure 11:
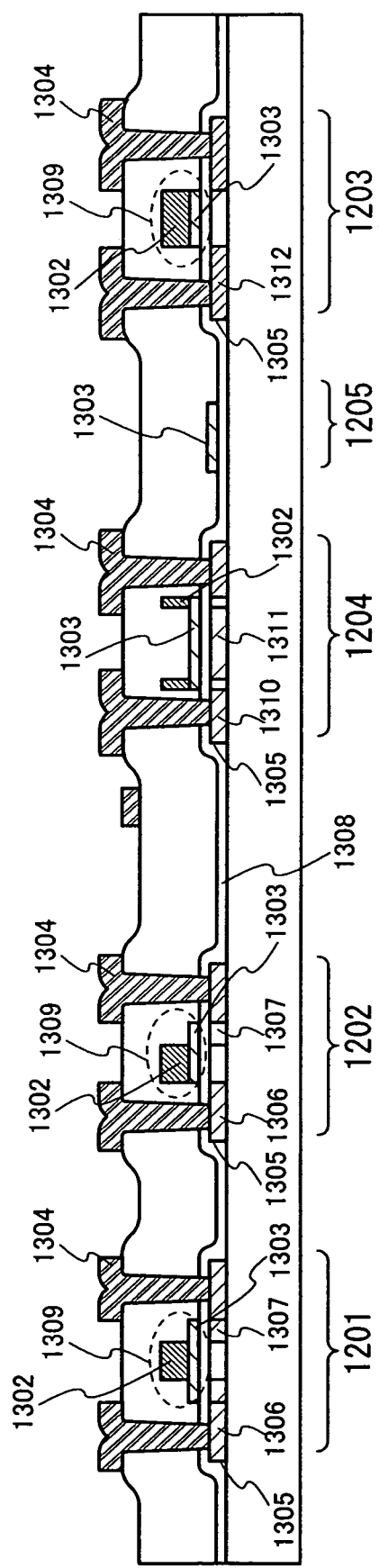
FIG. 11 is a view explaining Embodiment 1 of the present invention.

These circuits are formed by including a transistor. The transistor can be formed by a thin film transistor (TFT) besides a MOS transistor formed in a single crystalline substrate. FIG. 11 is a view showing a cross-sectional structure of a transistor which forms these circuits. FIG. 11 shows an n-channel transistor 1201, an n-channel transistor 1202, a capacitor element 1204, a resistance element 1205, and a p-channel transistor 1203. Each transistor is provided with a semiconductor layer 1305, an insulating layer 1308, and a gate electrode 1309. The gate electrode 1309 is formed by a stacked structure of a first conductive layer 1303 and a second conductive layer 1302. FIGS. 12A to 12E are top views corresponding to the transistors, the capacitor element, and the resistance element, which can be referred together with FIG. 11.

In FIG. 11, in the n-channel transistor 1201, an impurity region 1306 connected to a wiring 1304 and formed a source and a drain regions, and an impurity region 1307 doped to have lower concentration than impurity concentration of the impurity region 1306, are formed in the semiconductor layer 1305 in a channel length direction (direction in which carriers flow). The impurity region 1307 is also referred to as a lightly doped drain (LDD). When the n-channel transistor 1201 is formed, phosphorus or the like is added to the impurity region 1306 and the impurity region 1307 as an impurity which imparts n-type. The LDD is formed as a means for suppressing hot electron deterioration or a short-channel effect.

As shown in FIG. 12A, in the gate electrode 1309 of the n-channel transistor 1201, the first conductive layer 1303 is formed to be spread to both sides of the second conductive layer 1302. In this case, the first conductive layer 1303 is formed to be thinner than the second conductive layer. The first conductive layer 1303 is formed to have a thickness through which ion species accelerated with an electric field of 10 to 100 kV can be made to pass. The impurity region 1307 is formed so as to overlap with the first conductive layer 1303 of the gate electrode 1309. In other words, an LDD region which overlaps with the gate electrode 1309 is formed. In this structure, in the gate electrode 1309, the impurity region 1307 is formed in a self-aligned manner by adding an impurity having one conductivity type through the first conductive layer 1303 using the second conductive layer 1302 as a mask. In other words, the LDD which overlaps with the gate electrode is formed in a self-aligned manner.

A transistor having the LDD on both side of a channel forming region can be applied to a TFT for rectification of the power supply circuit 503 in FIG. 10 or a transistor which forms a transmission gate (also referred to as an analog switch) used for a logic circuit. In these TFTs, both positive and negative voltages are applied to source and drain electrodes; therefore, the LDD is preferably provided on both side of the channel forming region.

In FIG. 11, in the n-channel transistor 1202, an impurity region 1306 which forms a source and a drain regions and is connected to a wiring 1304, and an impurity region 1307 doped to have lower concentration than impurity concentration of the impurity region 1306, are formed in the semiconductor layer 1305. The impurity region 1307 is provided so as to be in contact with the impurity region 1306 on one side of the channel forming region. As shown in FIG. 12B, in the gate electrode 1309 of the n-channel transistor 1202, the first conductive layer 1303 is formed to be spread to one side of the second conductive layer 1302. Also in this case, the LDD can be formed in a self-aligned manner by adding an impurity having one conductivity type through the first conductive layer 1303 using the second conductive layer 1302 as a mask.

The transistor having the LDD on one side of the channel forming region may be applied to a transistor to which only a positive voltage or a negative voltage is applied between the source and drain electrodes. Specifically, the transistor may be applied to a transistor which forms a logic gate such as an inverter circuit, a NAND circuit, a NOR circuit, or a latch circuit, or a transistor which forms an analog circuit such as a sense amplifier, a constant voltage generation circuit, or a VCO.

In FIG. 11, the capacitor element 1204 is formed so that the gate insulating layer 1308 is interposed between the first conductive layer 1303 and the semiconductor layer 1305. The semiconductor layer 1305 which forms the capacitor element 1204 is provided with an impurity region 1310 and an impurity region 1311. The impurity region 1311 is formed in a position of overlapping with the first conductive layer 1303 in the semiconductor layer 1305. Further, the impurity region 1310 is connected to the wiring 1304. An impurity having one conductivity type can be added to the impurity region 1311 through the first conductive layer 1303; therefore, impurity concentrations contained in the impurity region 1310 and the impurity region 1311 can be the same or different from each other. In either case, the semiconductor layer 1305 is made to serve as an electrode in the capacitor element 1204; therefore, an impurity having one conductivity type is preferably added to lower resistance. In addition, the first conductive layer 1303 can be made to serve as an electrode sufficiently by utilizing the second conductive layer 1302 as an auxiliary electrode as shown in FIG. 12C. Thus, by employing a compositive electrode structure in which the first conductive layer 1303 and the second conductive layer 1302 are combined, the capacitor element 1204 can be formed in a self-aligned manner.

The capacitor element is used as a storage capacitor included in the power supply circuit 503 or a resonant capacitor included in the resonant circuit 502 in FIG. 10. In particular, because both positive and negative voltages are applied between two terminals of the capacitor element, the resonant capacitor is necessary to serve as a capacitor whether a voltage applied between the two terminals is positive or negative.

In FIG. 11, the resistance element 1205 is made of the first conductive layer 1303. The first conductive layer 1303 is formed to have a thickness of approximately 30 to 150 nm; therefore, the resistance element can be formed by appropriately setting a width or length thereof.

The resistance element is used as a resistance load included in the modulation circuit 508 in FIG. 10. In addition, there is a case where the resistance element is used as a load in controlling a current by a VCO or the like. The resistance element may be formed by a semiconductor layer including an impurity element at high concentration or a thin metal layer. The metal layer is preferable because a resistance value thereof is determined by a thickness and a film quality, and thus variation is small, while a resistance value of the semiconductor layer depends on a thickness, a film quality, impurity concentration, an activation ratio, and the like.

In FIG. 11, the p-channel transistor 1203 is provided with an impurity region 1312 in the semiconductor layer 1305. This impurity region 1312 forms source and drain regions connected to the wiring 1304. The gate electrode 1309 has a structure in which the first conductive layer 1303 and the second conductive layer 1302 overlap. The p-channel transistor 1203 is a transistor having a single drain structure without providing an LDD. In a case of forming the p-channel transistor 1203, boron or the like is added to the impurity region 1312 as an impurity which imparts p-type. On the other hand, if phosphorus is added to the impurity region 1312, an n-channel transistor having a single drain structure can be formed.

Excitation with a microwave may be conducted and oxidizing or nitriding treatment may be conducted using high-density plasma treatment with electron temperature of 2 eV or less, ion energy of 5 eV or less, and electron density of approximately $10^{11}$ to $10^{13}/cm^3$, with respect to one or both of the semiconductor layer 1305 and the gate insulating layer 1308. At this time, treatment is conducted with substrate temperature of 300 to 450° C. and an oxidizing atmosphere ($O_2$, $N_2O$, or the like) or a nitriding atmosphere ($N_2$, $NH_3$, or the like), thereby obtaining a fine insulating film having a uniform thickness in which plasma damage is suppressed. In other words, generation of a charged defect and variation of a threshold voltage of a transistor can be suppressed.

By such treatment using high-density plasma, the insulating layer 1308 having a thickness of 1 to 20 nm, typically, 5 to 10 nm is formed on the semiconductor layer 1305. Reaction in this case is solid phase reaction; therefore, interface state density between the insulating film and the semiconductor film can be extremely lowered. By the high-density plasma treatment as described above, a semiconductor film (crystalline silicon or polycrystalline silicon) is directly oxidized (or nitrided); therefore, variation of a thickness of the insulating film to be formed can be made to be small. In addition, oxidization is not strongly conducted to a crystal grain boundary of crystalline silicon; therefore, a very favorable state can be obtained. In other words, by conducting solid phase oxidization to a surface of the semiconductor film by high-density plasma treatment shown here, an insulating film with favorable uniformity and low interface state density can be formed without conducting oxidation reaction extraordinarily in a crystal grain boundary.

As the insulating layer 1308, only an insulating film formed by high-density plasma treatment may be used, or an insulating film such as silicon oxide, silicon oxynitride, or silicon nitride may be deposited thereon to be stacked by a CVD method utilizing plasma or thermal reaction. In either case, as for a transistor formed by including the insulating film formed using high-density plasma in the part or entire of the gate insulating film, variation in characteristics can be made to be small.

In a case where a transistor is driven at a voltage of 3 V or less, the insulating layer which is oxidized or nitrided by this plasma treatment is preferable to be used as the gate insulating layer 1308. In a case where a transistor is driven at a voltage of 3 V or more, the gate insulating layer 1308 can be formed by combing the insulating layer which is formed on a surface of the semiconductor layer 1305 by this plasma treatment and the insulating layer which is deposited by a CVD method (a plasma CVD method or a thermal CVD method). In the same manner, this insulating layer can be utilized as a dielectric layer of the capacitor element 1204. In this case, the insulating layer formed by this plasma treatment is formed to have a thickness of 1 to 10 nm and to be fine; therefore, a capacitor element having large charge capacity can be formed.

It is to be noted that a crystallization method accompanied with heat treatment of a semiconductor layer in the semiconductor layer 1305 and a crystallization method of conducting irradiation of a continuous wave laser or a laser beam oscillated with a frequency of 10 MHz or more may be combined. In either case, a surface of the crystallized semiconductor film can be flattened by the irradiation of the continuous wave laser or laser beam oscillated with a frequency of 10 MHz or more. Accordingly, the gate insulating film can be thinned, and it can contribute to the enhancement of withstand pressure of the gate insulating film.

Further, semiconductor layers 1305, which are obtained by conducting scanning in one direction while irradiation of the continuous wave laser or laser beam oscillated with a frequency of 10 MHz or more is conducted with respect to a semiconductor film to be crystallized, have a property that a crystal is grown in a scanning direction of the beam. By arranging a transistor by setting the scanning direction to a channel length direction (direction in which carriers flow when a channel forming region is formed) and combing the gate insulating layer, a transistor (TFT) with small variation in characteristics and high electron field-effect mobility can be obtained.

As explained with reference to FIGS. 11 and 12A to 12E, elements having various structures can be formed by combing conductive layers each having a different thickness. A region where only the first conductive layer is formed and a region where the first conductive layer and second conductive layer are stacked can be formed using a photomask or the reticle, in which supplementary patterns having a function to reduce the intensity of light and composed of a diffraction grating pattern or a translucent film is set. In other words, in a photolithography step, thicknesses of a resist mask to be developed are differentiated by adjusting the amount of transmitted light of the photomask in a case where a photo resist is exposed to light. In this case, a resist having the complicated shape may be formed by providing a slit having resolution limitation or less to the photomask or the reticle. Further, a mask pattern made of a photo resist material may be deformed by baking at approximately 200° C. after development.

Further, by using the photomask or the reticle, in which a supplementary pattern having a function to reduce the intensity of light and composed of a diffraction grating patterns or a translucent film is set, the region where only the first conductive layer is formed and the region where the first conductive layer and second conductive layer are stacked can be formed in succession. As shown in FIG. 12A, the region where only the first conductive layer is formed can be selectively formed on the semiconductor layer. Such a region is effective on the semiconductor layer; however, the region is not necessary in a region (a wiring region which is connected to the gate electrode) except for the region. By using the photomask or the reticle, the region of only the first conductive layer is not necessary to be formed in a wiring portion; therefore, wiring density can be increased substantially.

In a case of FIG. 11 and FIGS. 12A to 12E, the first conductive layer is made of refractory metal such as tungsten (W), chromium (Cr), tantalum (Ta), tantalum nitride (TaN), or molybdenum (Mo); or alloy or a compound containing refractory metal as its main component, to have a thickness of 30 to 50 nm. The second conductive layer is made of refractory metal such as tungsten (W), chromium (Cr), tantalum (Ta), tantalum nitride (TaN), or molybdenum (Mo); or alloy or a compound containing refractory metal as its main component, to have a thickness of 300 to 600 nm. For example, the first conductive layer and the second conductive layer are made of the different conductive material in order to generate difference in etching rate in an etching step which will be conducted later. As one example, TaN can be used for the first conductive layer and a tungsten film can be used for the second conductive layer.

This embodiment shows that transistors each having a different electrode structure, a capacitor element, and a resistance element can be manufactured to be differentiated from each other by using the photomask or the reticle, in which a supplementary pattern having a function to reduce the intensity of light and composed of a diffraction grating patterns or a translucent film is set. According to this, elements having a different mode can be formed and integrated without increasing the number of steps.

It is to be noted that this embodiment can be freely combined with another embodiment mode or embodiment.

Embodiment 2

An example of forming a static RAM (SRAM) as one element which forms a semiconductor device shown in FIG. 10 will be explained with reference to FIGS. 13A and 13B, 14A and 14B, and 15A and 15B.

Figure 13A:
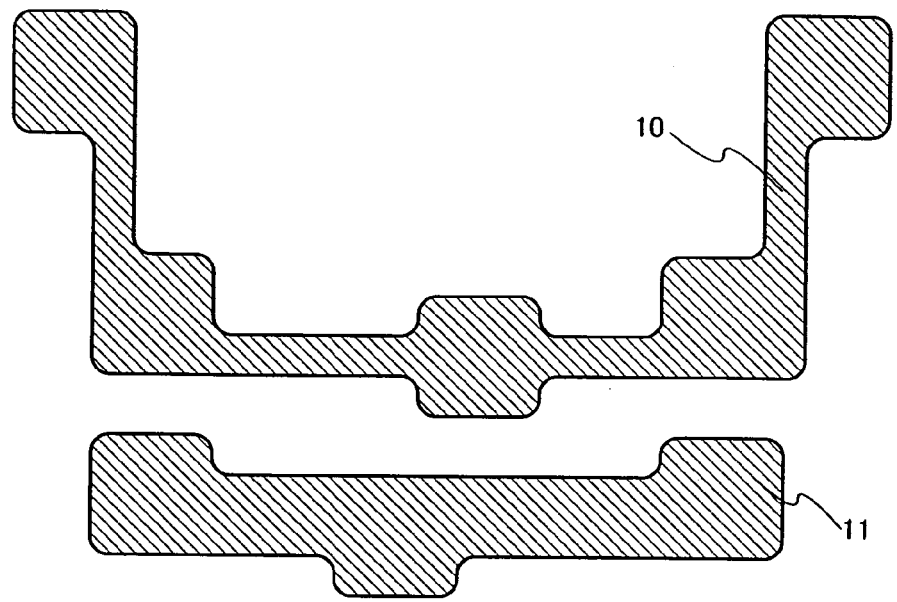
FIGS. 13A and 13B are views explaining Embodiment 2 of the present invention.

Semiconductor layers 10 and 11 shown in FIG. 13A is preferably made of silicon or a crystalline semiconductor containing silicon as its component. For example, polycrystalline silicon which is formed by crystallizing a silicon film by laser annealing or the like, single crystal silicon, or the like is applied. Besides, a metal oxide semiconductor, amorphous silicon, or an organic semiconductor, which shows semiconductor characteristics, can be applied.

In either case, a semiconductor layer which is formed first is formed on the entire surface or part (a region having a larger area than an area which is confirmed as a semiconductor region of a transistor) of a substrate having an insulating surface. Then, a mask pattern is formed on the semiconductor layer by photolithography. And then, the semiconductor layer is etched utilizing the mask pattern to form island-like semiconductor layers 10 and 11 having a particular shape including source and drain regions and a channel forming region of a TFT. The semiconductor layers 10 and 11 are determined in view of adequacy of layout.

Figure 13B:
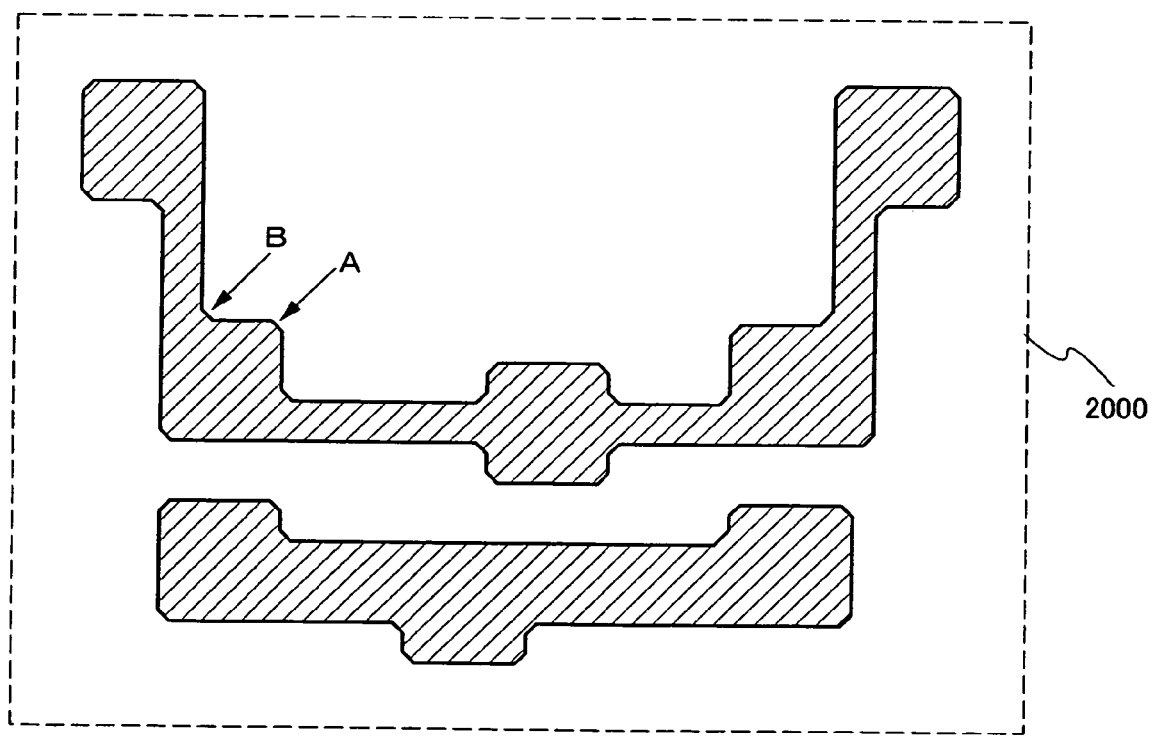

A photomask for forming the semiconductor layers 10 and 11 shown in FIG. 13A is provided with a mask pattern 2000 shown in FIG. 13B. This mask pattern 2000 is different based on whether a resist used in a photolithography step is a positive type or a negative type. In a case of using the positive type resist, the mask pattern 2000 shown in FIG. 13B is manufactured as a light shielding portion. The mask pattern 2000 has a shape in which a vertex portion A of a polygon is eliminated. An inside of a corner B has a shape in which its corner portion is bended in multiple degrees so as not to be a right angle. In this pattern of the photomask, an angular portion of the corner portion is eliminated.

The shape of the mask pattern 2000 shown in FIG. 13B is reflected in the semiconductor layers 10 and 11 shown in FIG. 13A. In that case, although the shape similar to the mask pattern 2000 may be transferred, the transfer may be conducted so that the corner portion of the mask pattern 2000 is further rounded. In other words, a round portion in which the pattern shape is smoothed more than the mask pattern 2000 may be provided.

Figure 14A:
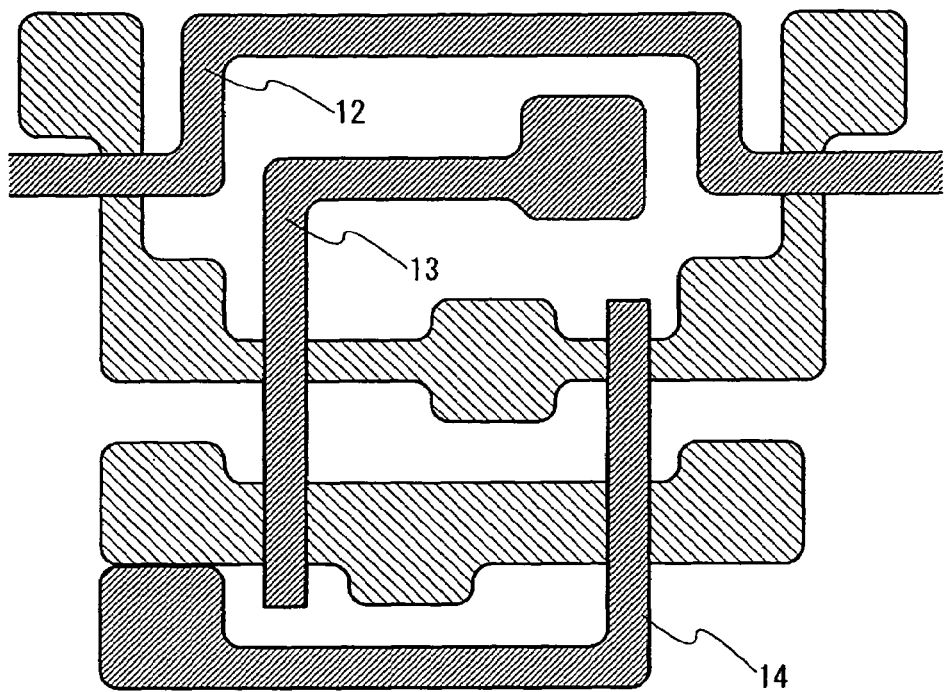
FIGS. 14A and 14B are views explaining Embodiment 2 of the present invention.

An insulating layer including silicon oxide or silicon nitride in at least part of the insulating layer is formed on the semiconductor layers 10 and 11. One of the objects for forming this insulating layer is a gate insulating layer. Then, as shown in FIG. 14A, gate wirings 12, 13, and 14 are formed so as to partly overlap with the semiconductor layer. The gate wiring 12 is formed corresponding to the semiconductor layer 10, the gate wiring 13 is formed corresponding to the semiconductor layers 10 and 11, and the gate wiring 14 is formed corresponding to the semiconductor layers 10 and 11. As the gate wiring, a metal layer or a semiconductor layer having high conductivity is formed and the shape thereof is reformed on the insulating layer by photolithography.

Figure 14B:
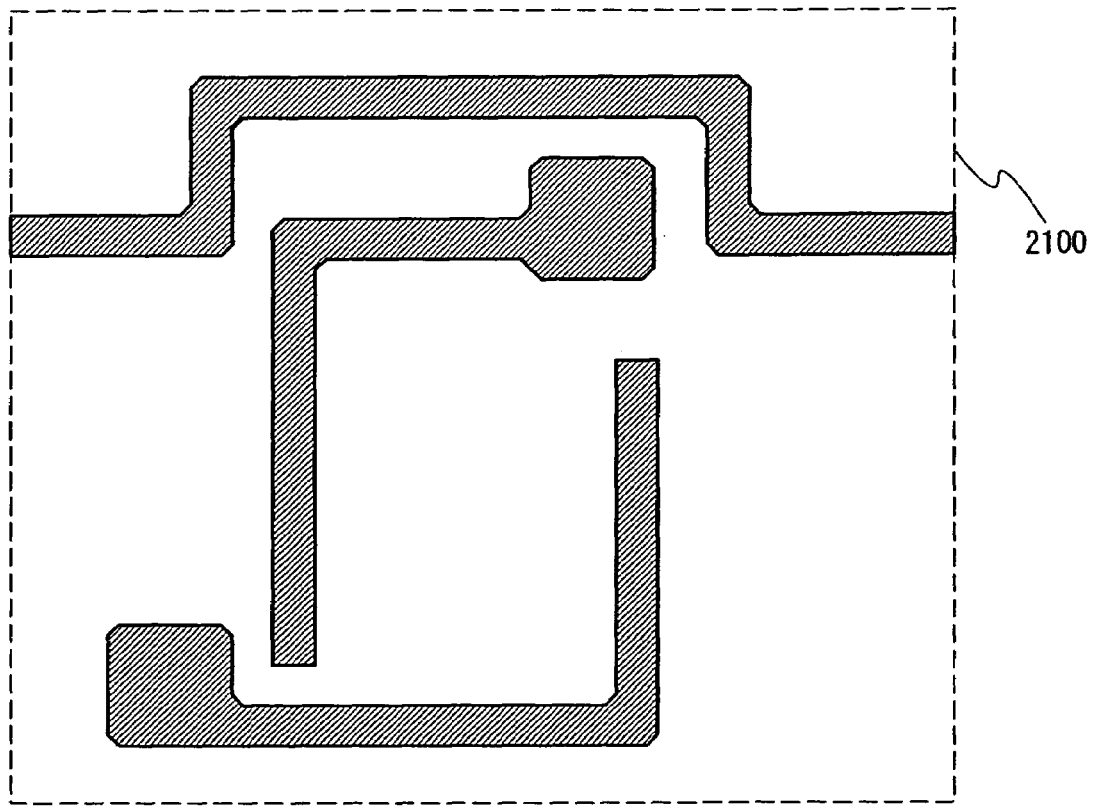

A photomask is provided with a mask pattern 2100 shown in FIG. 14B. In this mask pattern 2100, an angular portion of a corner portion of the mask pattern is eliminated by a length of a half or less and a fifth or more of the line width of the wiring. The shape of the mask pattern 2100 shown in FIG. 14B is reflected in the gate wirings 12, 13, and 14 shown in FIG. 14A. In that case, although the shape similar to the mask pattern 2100 may be transferred, the transfer may be conducted so that the corner portion of the mask pattern 2100 is further rounded. In other words, a round portion in which the pattern shape is smoothed more than the mask pattern 2100 may be provided to the gate wirings 12, 13 and 14. Outside of the corner portion of the gate wirings 12, 13 and 14 has an effect that the generation of fine powder by abnormal electrical discharge in dry etching using plasma can be suppressed. Inside of the corner portion has an effect in cleaning that even if fine powder is attached to the substrate, it is possible to wash away the fine powder without retention of cleaning solutions in the corner portion of the wiring pattern.

An interlayer insulating layer is a layer formed next to the gate wirings 12, 13, and 14. The interlayer insulating layer is formed by an inorganic insulating material such as silicon oxide or an organic insulating material using polyimide, acrylic resin, or the like. An insulating layer such as silicon nitride or silicon nitride oxide may be interposed between this interlayer insulating layer and the gate wirings 12, 13, and 14. Further, an insulating layer such as silicon nitride or silicon nitride oxide may be provided also on the interlayer insulating layer. According to this insulating layer, the semiconductor layer and the gate insulating layer can be prevented from being contaminated by an impurity such as an extrinsic metal ion or moisture which is not good for a TFT.

Figure 15A:
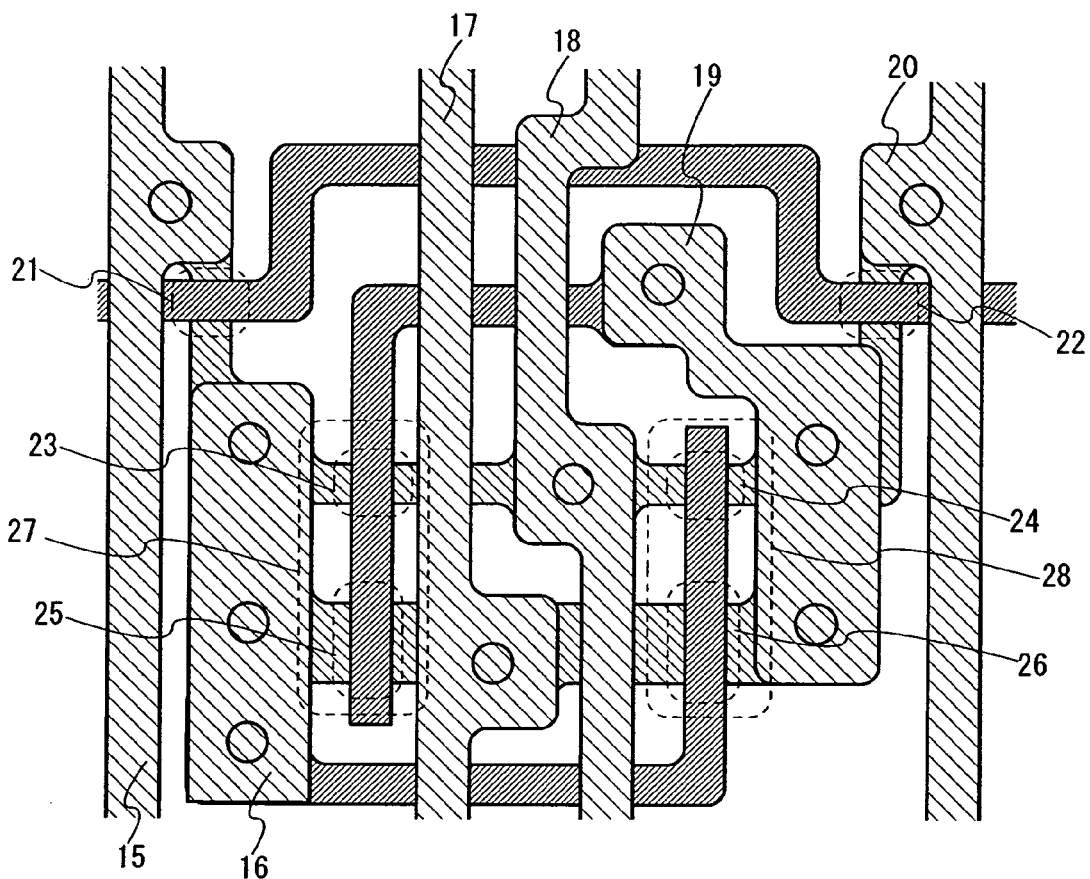
FIGS. 15A and 15B are views explaining Embodiment 2 of the present invention.

In the interlayer insulating layer, an opening is formed in a predetermined position. For example, the opening is provided corresponding to the gate wiring or semiconductor layer in the lower layer. A mask pattern is formed by photolithography, and a wiring layer formed by one layer or a plurality of layers made of metal or a metal compound is formed in a predetermined pattern by etching process. Accordingly, as shown in FIG. 15A, wirings 15 to 20 are formed so as to partly overlap with the semiconductor layer. The wiring connects particular elements. The wiring connects the particular elements not with a straight line but with a line including a bend portion due to limitation of layout. In addition, a wiring width is changed in a contact portion or the other regions. The wiring width of a contact portion is changed to be widened in a portion where the size of a contact hole is the same as or larger than the wiring width.

Figure 15B:
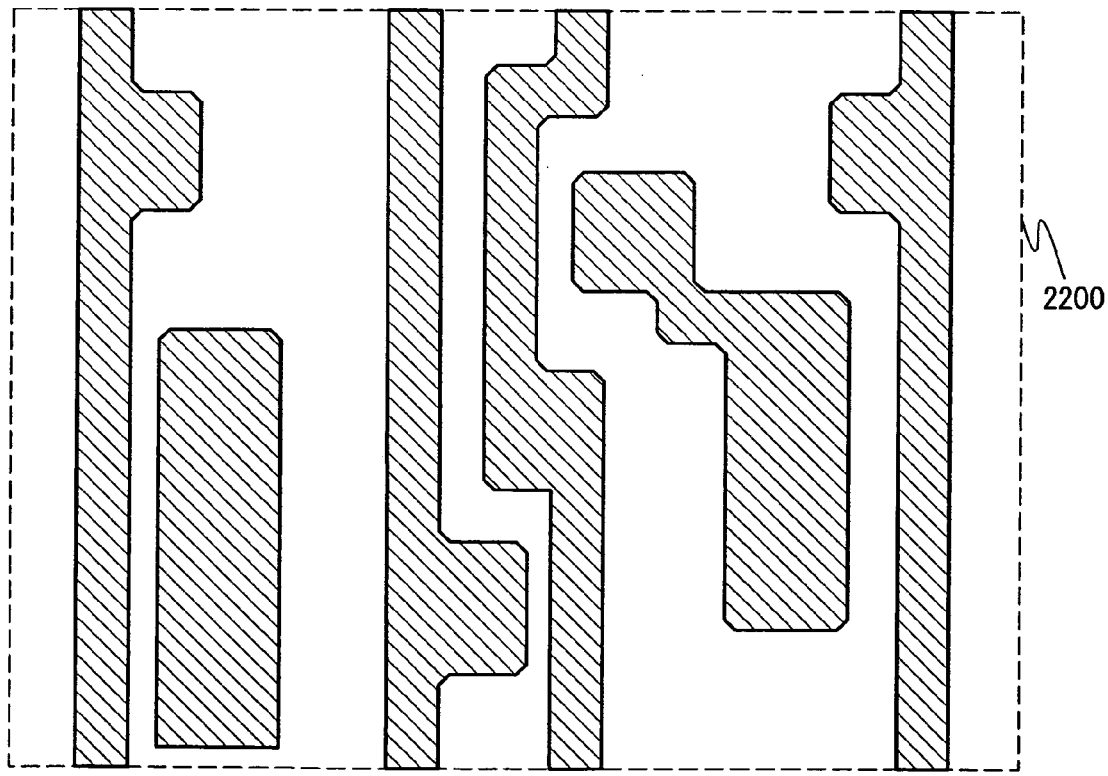

A photomask for forming the wirings 15 to 20 is provided with a mask pattern 2200 shown in FIG. 15B. Also in this case, in a corner portion of the wiring, which is bent into an L-shape, respectively, an angular portion of the corner portion is eliminated so that a side length of a right triangle is 10 μm or less, or a half or less and a fifth or more of the line width of the wiring. Accordingly, the corner portion of the wiring is made to have a rounded pattern. In other words, outer periphery of a wiring layer in the corner portion viewed from above is made to form a curved line. Specifically, part of the wiring layer corresponding to a isosceles right triangle, which is formed by first two straight lines interposing the corner portion and being perpendicular to each other and a second straight line at approximately 45 degrees to these first two straight lines, is eliminated so that an outer peripheral edge of the corner portion is made to be rounded. When the elimination is finished, two obtuse angle portions are newly formed in the wiring layer. The wiring layer is preferably etched so that a curved line, which is in contact with both of the first straight line and the second straight line, is formed in each obtuse angle portion by appropriately conducting a mask design and setting an etching condition. It is to be noted that length of two sides of the isosceles right triangle, which are equal to each other, is made to be a fifth or more and a half or less of the width of the wiring. An inner periphery of the corner portion is also formed to be rounded along the outer periphery of the corner portion. In such a shape of a wiring, the generation of fine powder by abnormal electrical discharge in dry etching using plasma can be suppressed. In cleaning of the substrate, even if fine powder is attached to the substrate, it is possible to wash away the fine powder without retention of cleaning solutions in the corner portion of the wiring pattern. As a result, there is an effect that yield can be improved. Thus is also advantageous that when many parallel wirings are provided over the substrate, fine powder attached to the substrate can be easily washed away. In addition, the corner portion of the wiring is rounded, and accordingly, electric conduction can be expected.

In FIG. 15A, n-channel transistors 21 to 24, p-channel transistors 25 and 26 are formed. Inverters 27 and 28 include the n-channel type transistor 23 and p-channel transistor 25, and the n-channel type transistor 24 and p-channel transistor 26, respectively. A circuit including these six transistors forms SRAM. In the upper portion of these transistors, an insulating layer made of silicon nitride, silicon oxide, or the like may be formed.

It is to be noted that this embodiment can be freely combined with another embodiment mode or embodiment.

Embodiment 3

Figure 16A:
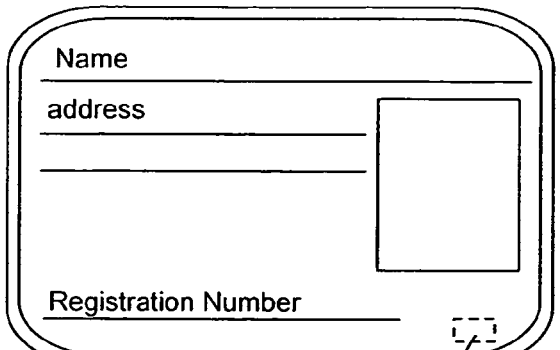
FIGS. 16A to 16E are views explaining Embodiment 3 of the present invention.
Figure 16B:
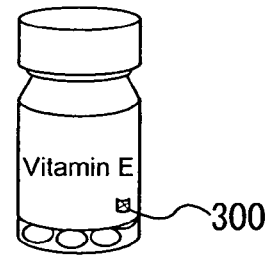
Figure 16C:
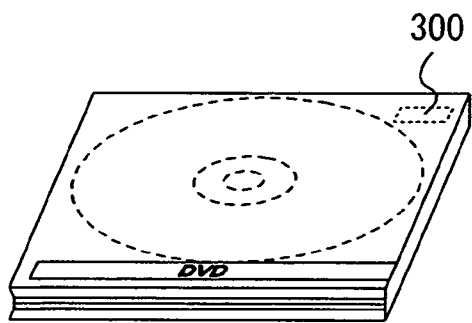
Figure 16D:
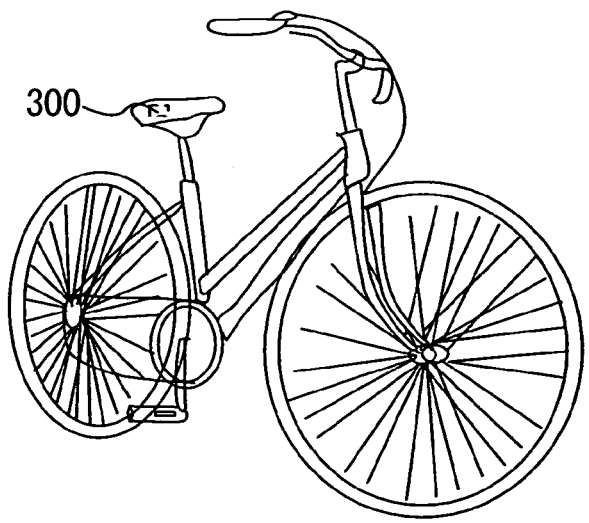
Figure 16E:
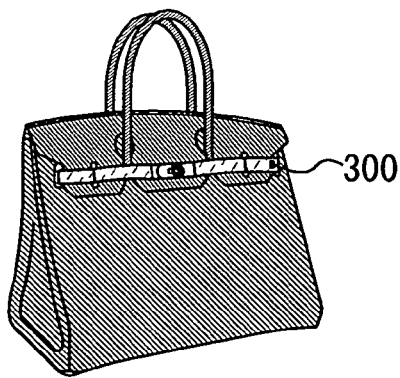
Figure 17:
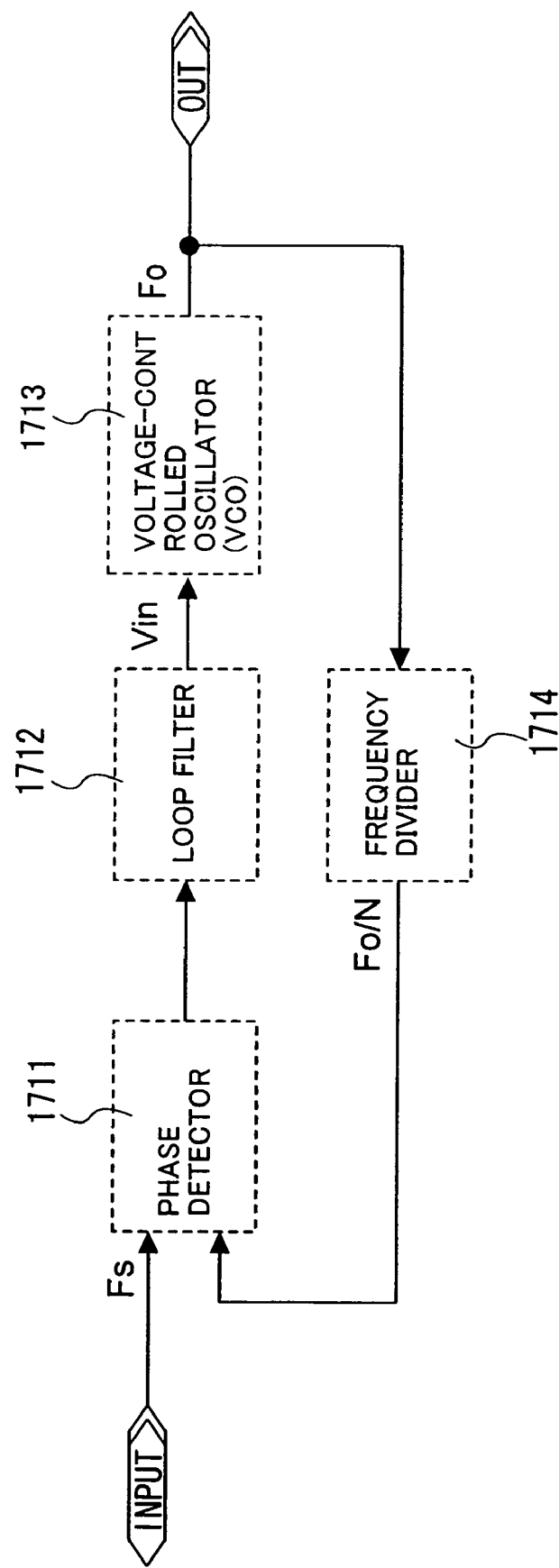
FIG. 17 is a diagram explaining a conventional mode.

The semiconductor device 300 described in Embodiments 1 and 2 can transmit and receive data wirelessly, and accordingly it can be applied to various uses. For example, the semiconductor device can be attached to or embedded in bills, coins, securities, bearer bonds, documents (e.g., driver's licenses, resident's cards, or the like, as shown in FIG. 16A), books, packaging containers (e.g., wrapping paper, bottles, or the like, as shown in FIG. 16B), recording media (e.g., DVD- R, video tapes, or the like, as shown in FIG. 16C), transportation devices (e.g., bicycles or the like, as shown in FIG. 16D), personal ornaments and accessories (shoes, glasses, or the like, as shown in FIG. 16E), groceries, clothing, everyday commodities, electronic apparatuses (e.g., liquid crystal display devices, EL display devices, television sets, portable terminals, or the like), or the like. For example, when applied to bills, coins, documents, or the like, the semiconductor device is attached to the surface thereof or embedded therein. When applied to a book, the semiconductor device is attached to the paper of the front cover or embedded therein. When applied to a packaging container, the semiconductor device is attached to the organic resin which forms the packaging container, or embedded therein. Moreover, if the semiconductor device is formed to have an identification function by giving an ID number in a memory circuit included in the semiconductor device, the applicable range of the semiconductor device can be further widened. For example, by applying the semiconductor device to a goods management system, an authentication system, a circulation system, or the like, high functionality, multifunctionality, and high added value of the system can be achieved.

It is to be noted that this embodiment can be freely combined with another embodiment mode or embodiment.

Embodiment 4

In this embodiment, a business model using a product provided with a semiconductor device explained in Embodiment 3 will be described.

A specific outline of this embodiment will be described with reference to FIGS. 19A to 19C. As a specific product provided with a semiconductor device, a book; a file; an image production which is taken in a video tape or the like; and the like are given. A product 1900 in FIGS. 19A to 19C is a group of products which is published in order of volume, number, or episode, or necessary to be displayed in particular order.

Figure 19A:
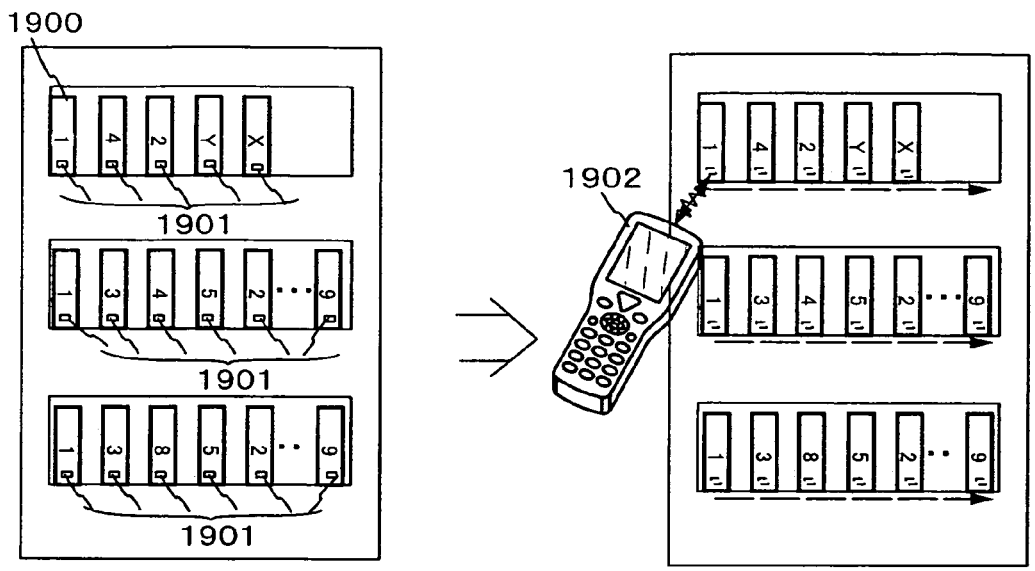
FIGS. 19A to 19C are views explaining Embodiment 4 of the present invention.
Figure 19B:
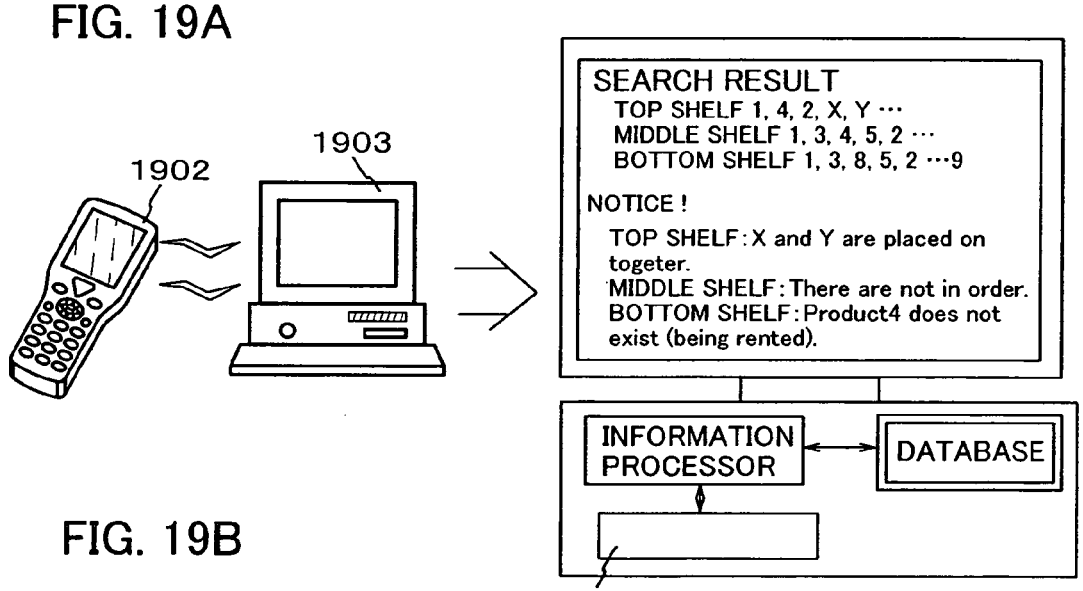
Figure 19C:
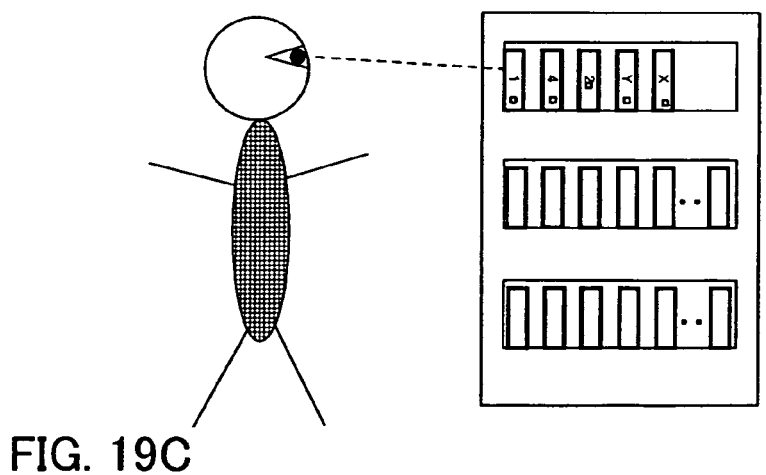

First, as shown in FIG. 19A, a semiconductor device 1901 is attached to the product 1900, respectively. This semiconductor device 1901 may be attached in the product or may be embedded in advance before shipment. Information on the product 1900 may be inputted in advance before shipment or may be rewritten to be used.

Then, scanning is conducted by a reader/writer 1902 (hereinafter, referred to as R/W) with respect to the product, thereby reading location information (also referred to as display data) of the product 1900. At this time, a method for setting the product on is not limited in particular as long as the location information of the product can be read. In that case, design may be conducted so that directivity of an antenna of the semiconductor device is not limited when information is read by the R/W.

In this embodiment, although a case where display is conducted by setting the products on a shelf is assumed to be explained, it is to be noted that the present invention is not limited thereto. Any state is acceptable as long as information on the product is read, and the product may be set on in disorder or may be piled up.

Then, as shown in FIG. 19B, the location information of the product 1900 read by the R/W 1902 is inputted in a computer 1903. The R/W 1902 and the computer 1903 may be connected with wireless communication or may be connected with wired communication. Location data of the product which is read by the R/W 1902 is displayed on a display portion of the computer 1903. The information to be displayed is connected to a database through an information processor, thereby displaying information which is collated with information on the product such as a stock status or rental information of the product. The information to be displayed is preferable to be displayed when there is a missing number in sequence or order of the product.

Obviously, the present invention is not limited in particular to the display on the display portion of the computer by communicating information to the computer. For example, information may be displayed on a display portion provided for the R/W, or information which is verified with information on the product such as a stock status or lending information of the product may be displayed at the same time as information on the product is read while information on the product is inputted in a memory portion provided inside the R/W in advance.

And then, as shown in FIG. 19C, the group of the products which is displayed is arranged by hand. At this time, the arrangement of order of the product may be conducted using a machine or the like. In this case, reading by the R/W and connection of the computer with the database may also be conducted by a machine.

Figure 20:
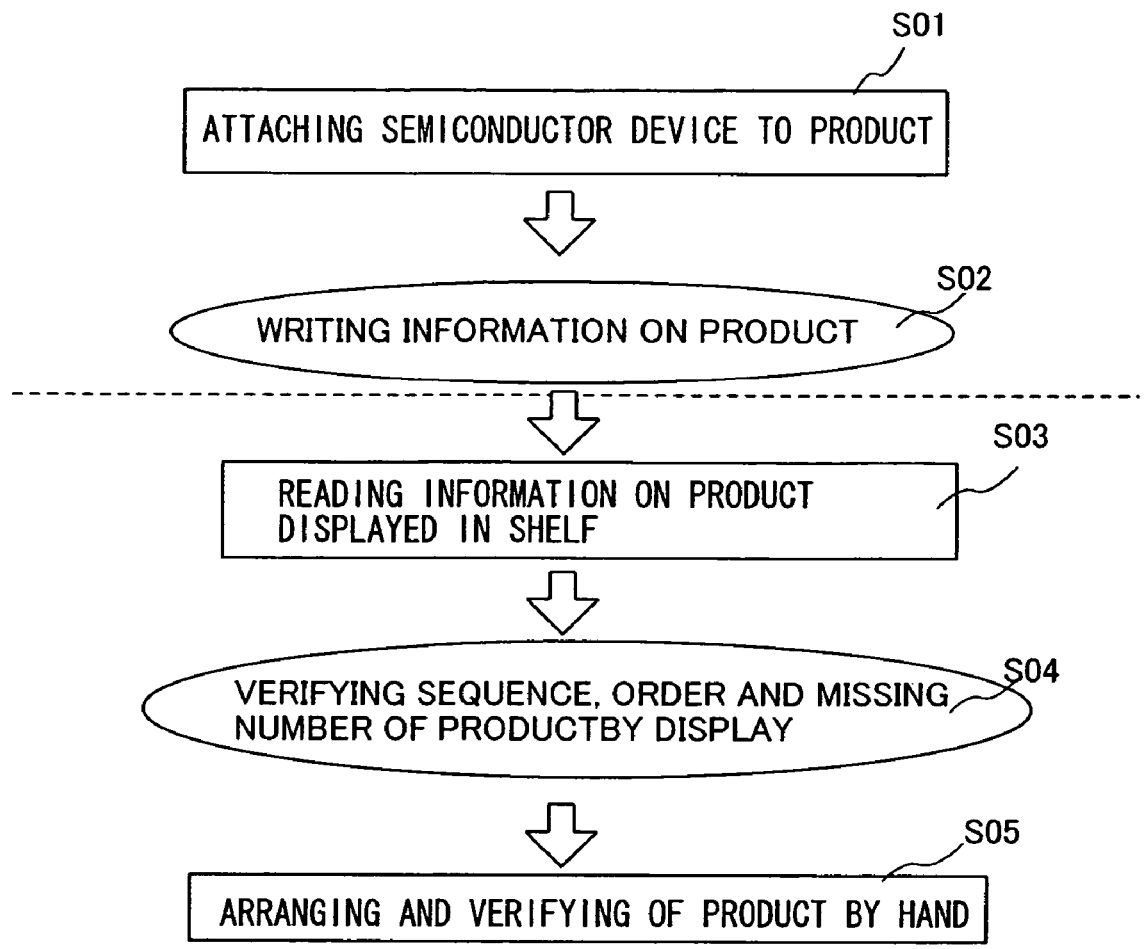
FIG. 20 is a view explaining Embodiment 4 of the present invention.

Next, the arrangement and verification of the product shown in FIGS. 19A to 19C will be explained using a flowchart shown in FIG. 20.

First, a step (S01) of attaching a semiconductor device to a product is conducted. Then, a step (S02) of writing information on the product in a memory provided for the semiconductor device is conducted. Here, information on the product is written in all semiconductor devices.

Then, a step (S03) of reading information on the product displayed in a shelf by a R/W is conducted. Then, a step (S04) of verifying sequence, order, and a missing number of the product by display is conducted. As described above, location data of the product may be verified by the R/W or information may be verified by transmitting data to the computer to read the other information from the database or the like.

And then, a step (S05) of arranging by hand a group of the products which is displayed is conducted. At this time, the arrangement of order of the product may be conducted using a machine or the like as described above.

It is to be noted that this embodiment can be freely combined with another embodiment mode or embodiment.

This application is based on Japanese Patent Application serial No. 2005-158220 field in Japan Patent Office on May 30th, 2005, the entire contents of which are hereby incorporated by reference.

What is claimed is:

1. A semiconductor device comprising:
an antenna;
a demodulation circuit operationally connected to the antenna;
a clock generation circuit operationally connected to the demodulation circuit; and
a modulation circuit operationally connected to the antenna,
wherein the clock generation circuit comprises a PLL circuit, an oscillator circuit and a determination circuit,
wherein, in a signal input portion, the determination circuit is a circuit which determines a first period from receiving a reception start signal to receiving a reception end signal and a second period except for the period from receiving a reception start signal to receiving a reception end signal, and
wherein a switch for selecting a connection of the PLL circuit to a signal output portion in the first period and selecting a connection of the oscillator circuit to the signal output portion in the second period is provided.

2. A semiconductor device according to claim 1,
wherein the PLL circuit comprises a phase detector, a loop filter, a voltage-controlled oscillator, and a frequency divider.

3. A semiconductor device according to claim 1,
wherein the PLL circuit comprises a prescaler or a swallow counter.

4. A semiconductor device according to claim 1,
wherein the oscillator circuit is a ring oscillator.

5. A semiconductor device comprising:
a resonant circuit;
a demodulation circuit operationally connected to the resonant circuit;
a clock generation circuit operationally connected to the demodulation circuit; and
a modulation circuit operationally connected to the resonant circuit,
wherein the clock generation circuit comprises a PLL circuit, an oscillator circuit and a determination circuit,
wherein, in a signal input portion, the determination circuit is a circuit which determines a first period from receiving a reception start signal to receiving a reception end signal and a second period except for the period from receiving a reception start signal to receiving a reception end signal, and
wherein a switch for selecting a connection of the PLL circuit to a signal output portion in the first period and selecting a connection of the oscillator circuit to the signal output portion in the second period is provided.

6. A semiconductor device according to claim 5,
wherein the PLL circuit comprises a phase detector, a loop filter, a voltage-controlled oscillator, and a frequency divider.

7. A semiconductor device according to claim 5,
wherein the PLL circuit comprises a prescaler or a swallow counter.

8. A semiconductor device according to claim 5,
wherein the oscillator circuit is a ring oscillator.

9. A semiconductor device comprising:
an antenna;
a demodulation circuit operationally connected to the antenna;
a clock generation circuit operationally connected to the demodulation circuit; and
a modulation circuit operationally connected to the antenna,
wherein the clock generation circuit comprises a PLL circuit, an oscillator circuit and a determination circuit,
wherein, in a signal input portion, the determination circuit is a circuit which determines a first period from receiving a reception start signal to receiving a reception end signal and a second period except for the period from receiving a reception start signal to receiving a reception end signal,
wherein a switch for selecting a connection of the PLL circuit to a signal output portion in the first period and selecting a connection of the oscillator circuit to the signal output portion in the second period is provided, and
wherein each of the PLL circuit, the oscillator circuit and the determination circuit comprises a transistor.

10. A semiconductor device according to claim 9,
wherein the PLL circuit comprises a phase detector, a loop filter, a voltage-controlled oscillator, and a frequency divider.

11. A semiconductor device according to claim 9,
wherein the PLL circuit comprises a prescaler or a swallow counter.

12. A semiconductor device according to claim 9,
wherein the oscillator circuit is a ring oscillator.

* * * * *